(12) United States Patent
Chiu et al.

(10) Patent No.: US 6,709,886 B2
(45) Date of Patent: Mar. 23, 2004

(54) METHOD OF FABRICATING MICROMACHINED DEVICES

(75) Inventors: Chen-Wei Chiu, Pasadena, CA (US); Tom Tsao, Pasadena, CA (US); Fukang Jiang, Pasadena, CA (US)

(73) Assignee: Umachines, Inc., Pasadena, CA (US)

( * ) Notice: Subject to any disclaimer, the term of this patent is extended or adjusted under 35 U.S.C. 154(b) by 0 days.

(21) Appl. No.: 09/843,025

(22) Filed: Apr. 25, 2001

(65) Prior Publication Data

US 2002/0106834 A1 Aug. 8, 2002

Related U.S. Application Data

(60) Provisional application No. 60/231,124, filed on Sep. 8, 2000, provisional application No. 60/218,550, filed on Jul. 13, 2000, and provisional application No. 60/200,497, filed on Apr. 25, 2000.

(51) Int. Cl.⁷ ............................................... H01L 21/00
(52) U.S. Cl. ............................. 438/64; 438/57; 438/69
(58) Field of Search ............................. 385/14; 359/224, 359/296, 223; 427/162; 438/57, 64, 69, 71, 72, 73, 117, 401, 597, 598, 599

(56) References Cited

U.S. PATENT DOCUMENTS

| | | |
|---|---|---|
| 4,386,244 A | 5/1983 | Murakami et al. |
| 5,226,099 A | 7/1993 | Mignardi et al. |
| 5,322,258 A | 6/1994 | Bosch et al. |
| 5,398,011 A | 3/1995 | Kimura et al. |
| 5,501,893 A | 3/1996 | Laermer et al. |
| 5,557,132 A | 9/1996 | Takahashi |
| 5,629,918 A | 5/1997 | Ho et al. |
| 5,724,015 A | 3/1998 | Tai et al. |
| 5,872,496 A | 2/1999 | Asada et al. |
| 6,136,212 A | 10/2000 | Mastrangelo et al. |
| 6,172,797 B1 | 1/2001 | Huibers |
| 6,201,629 B1 | 3/2001 | McClelland et al. |
| 6,205,267 B1 | 3/2001 | Aksyuk et al. |
| 6,307,663 B1 | 10/2001 | Kowarz |
| 6,335,224 B1 | 1/2002 | Peterson et al. |
| 6,351,329 B1 | 2/2002 | Greywall |
| 6,396,619 B1 | 5/2002 | Huibers et al. |
| 6,407,851 B1 | 6/2002 | Islam et al. |
| 6,424,450 B1 | 7/2002 | Goossen |
| 6,433,917 B1 | 8/2002 | Mei et al. |
| 6,445,840 B1 | 9/2002 | Fernandez et al. |
| 2002/0018613 A1 | 2/2002 | Bozler et al. |

OTHER PUBLICATIONS

PCT Written Opinon dated Jul. 18, 2003 in 7 pages.
PCT International Search Report dated Sep. 16, 2002.
PCT International Search Report dated Sep. 24, 2002.

(List continued on next page.)

*Primary Examiner*—Evan Pert
*Assistant Examiner*—Scott B. Geyer
(74) *Attorney, Agent, or Firm*—Knobbe, Martens, Olson & Bear, LLP

(57) ABSTRACT

A method for fabricating a module for at least partially intercepting a light beam propagating along a beam path includes providing a single crystal silicon substrate with a first substrate surface and a second substrate surface. The method further includes forming a reflector support layer on the first substrate surface. The method further includes forming a support frame and at least one reflector by etching the substrate from the second substrate surface. The method further includes forming at least one electrical conduit on the reflector support layer. The method further includes forming a reflector support by etching the reflector support layer from the first substrate surface, the reflector support mechanically coupled to the support frame and the reflector, the reflector support movable such that the reflector is movable substantially perpendicularly to the first substrate surface.

13 Claims, 26 Drawing Sheets

OTHER PUBLICATIONS

Free–Space Micromachined Optical Switches for Optical Networking, L.Y. Lin, E.L. Goldstein, and R. W. Tkach, IEEE *Journal of Selected Topics in Quantum Electronics*, vol. 5, No. 1, Jan./Feb. 1999, pp. 4–9.

Hybrid–integrated laser–diode micro–external mirror fabricated by (110) silicon micromachining, Y. Uenishi, M. Tsugai, and M. Mehregany. *Electronics Leters*8th Jun. 1995, vol. 31, No. 12, pp. 965–966.

Integrated Parylene Micro Electro Mechanical Systems (MEMS), Xuan–Qi Wang, California Institute of Technology, Pasadena, California, 2000, pp. 1–14.

Laser diode wavelength locking using a micromachined silicon mirror, Neila Kaou, Cedrick Chappaz. Skandar Basrour, and Michel de Labachelerie, Part of the Symposium on Design, Test, and Microfabrication of MEMS and MOEMS, Paris, France, Mar.–Apr. 1999, pp. 765–772.

Microactuators with moving magnets for linear, torsional or multiaxial motion, B. Wagner, W. Benecke, G. Engelmann, and J. Simon, *Sensors and Actuators A*, vol. 32, 1992, pp. 598–503.

Optical and Surface Characterization of Poly–Si Raplica Mirrors for an Optical Fiber Switch, Makoto Mita, Philippe Helin, Daisuke Miyauchi, Hiroshi Toshiyoshi, and Hiroyuki Fujita., *Transducers* '99, Jun. 7–10, 1999, Sendai, Japan, pp. 332–335.

Self Aligned Vertical Mirrors and V–Grooves Applied to a Self–Latchig Matrix Switch for Optical Networks, Philippe Helin, Makoto Mita, and Hiryouuki Fujita, IEEE MEMS 2000, Jan. 23–27 2000, pp. 467–472.

Turnable Micromirror Switches Using (11) Silicon Wafer, Kyoung–Sun Seo, Young–Ho Cho and Sung–Kie Youn, MHS'96 Proceedings of the Seventh International Systemposim on Micro Machine and Human Science, Technical Session A–1, Microfabrication,. Nagoya Municipal Industrial Reearch Institute, Library of Congress No. 96–77510, pp. 73–77.

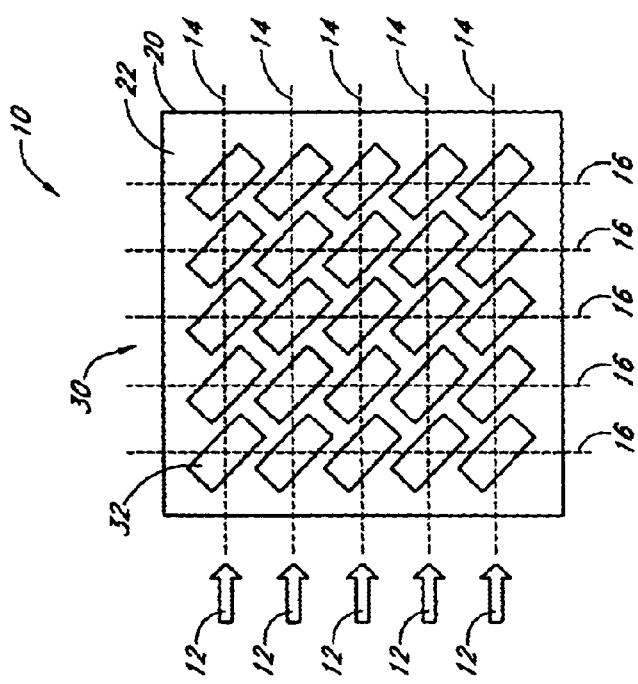
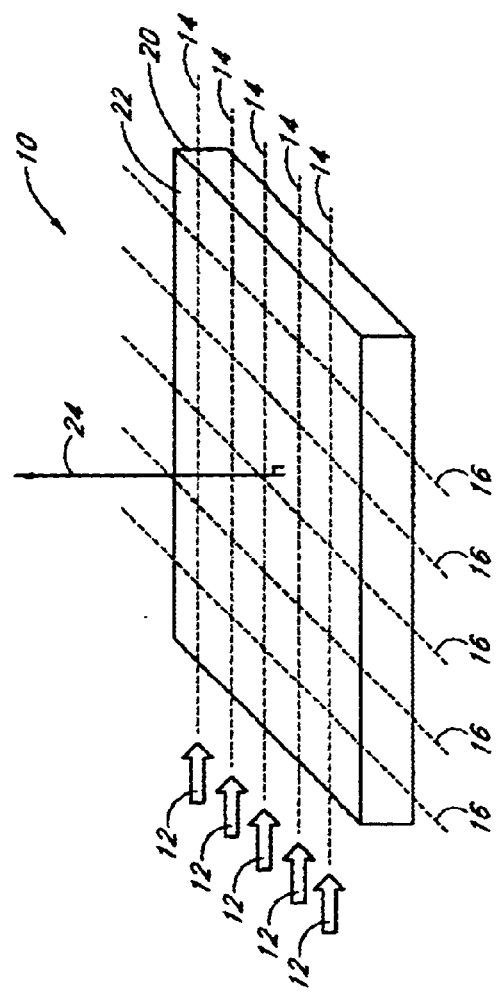

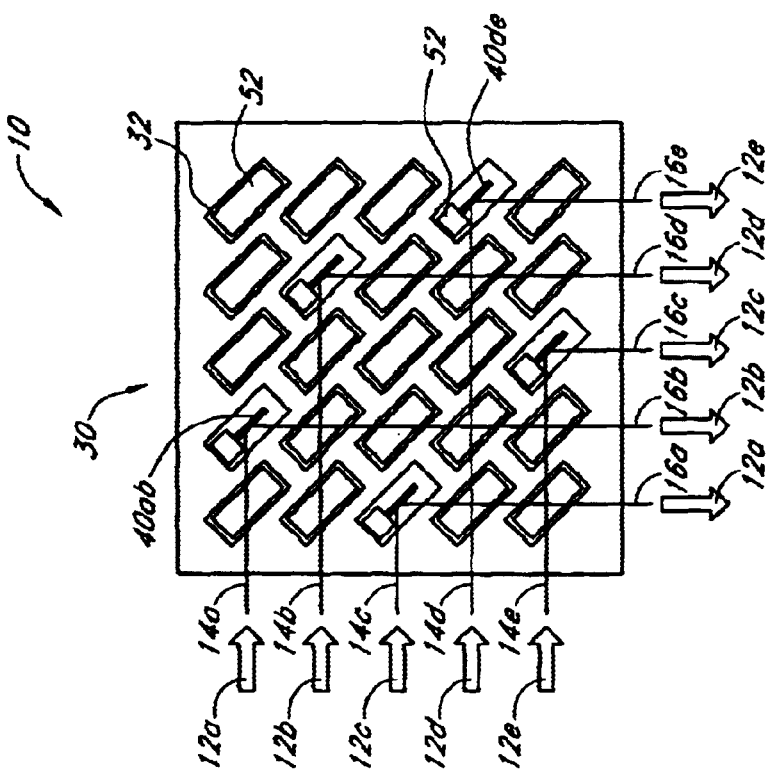

US 6,709,886 B2

METHOD OF FABRICATING MICROMACHINED DEVICES

This application claims priority under 35 U.S.C. §119(e) to the following U.S. provisional applications: Ser. No. 60/200,497 filed on Apr. 25, 2000, Ser. No. 60/218,550 filed on Jul. 13, 2000, and Ser. No. 60/231,124 filed on Sep. 8, 2000, the disclosures of which are hereby incorporated by reference in their entireties.

BACKGROUND OF THE INVENTION

1. Field of the Invention

The present invention is directed to methods of fabricating micromachine devices, and more specifically, to fabricating silicon micromachined optical attenuators and switches for a plurality of light beams propagating along a respective plurality of beam paths.

2. Description of the Related Art

Micro-electro-mechanical systems (MEMS) are physically small systems with both electrical and mechanical components, and with dimensions on the order of microns. To achieve the small dimensions of the various components, MEMS are typically fabricated using techniques which were developed in part for integrated circuit fabrication. MEMS-based devices are found in an increasing number of applications, such as inkjet-printer cartridges, accelerometers that deploy car airbags, and other sensors and actuators. MEMS has developed into a growth industry with an estimated yearly market of tens of billions of dollars. In addition, MEMS-based optical systems, such as optical attenuators and switches, are becoming increasingly important in the field of telecommunications and computer networks.

A variable optical attenuator (VOA) is a device which can adjust the optical signal power passing through an optical fiber transmission circuit, such as dense wavelength-division multiplexing (DWDM) systems. Because the amount of light passing through an optical fiber depends on the wavelength of the light, VOAs are often needed to ensure power equalization of the individual wavelengths by adjusting the intensity for each wavelength. VOAs used in fiber optic communications system may use absorptive or reflective techniques to controllably adjust the transmitted power.

An optical switch is a device which can selectively switch optical signals from one optical circuit to another, and are typically used in optical systems such as optical add/drop multiplexers (OADMs). Various technologies can be used in optical switches, including, but not limited to, physically shifting an optical fiber to drive one or more alternative fibers, physically moving a reflective element, electro-optic effects, or magneto-optic effects.

MEMS technology has been identified as being able to satisfy the requirements of optical systems in the telecommunications and computer networking fields. These requirements include multi-channel operation in a dense package, high reliability, sufficiently fast operation, and inexpensive fabrication techniques.

Typically, multiple MEMS devices are fabricated on the same wafer substrate to take advantage of economies of scale. To separate the MEMS devices from one another, the wafer substrate is diced and separated into chips, each of which comprises at least one of the MEMS devices. However, MEMS devices also typically contain various fragile components, such as the flaps, cantilevers. These MEMS components are often damaged by the standard processes of dicing and separating the wafer substrate into chips, thereby reducing the yield of MEMS devices obtained from a given wafer substrate.

Previous attempts to improve the yield of MEMS devices from diced and separated wafer substrates have included the addition of a photoresist layer to the wafer substrate, thereby covering the MEMS devices and providing structural support during the dicing and separating processes. However, the application of a photoresist layer includes a spin coating method, which induces forces and stresses which can also damage fragile MEMS devices. Spin coating also is inefficient for large area substrates and the use of photoresist materials leads to environmental, health, and safety issues. In addition, photoresist layers typically are not conformal and have poor step coverage, especially when applied to high aspect ratio structures.

SUMMARY OF THE INVENTION

According to one aspect of the present invention, a method of fabricating a module for at least partially intercepting a light beam propagating along a beam path comprises providing a single crystal silicon substrate with a first substrate surface and a second substrate surface. The method further comprises forming a reflector support layer on the first substrate surface. The method further comprises forming a support frame and at least one reflector by etching the substrate from the second substrate surface. The method further comprises forming at least one electrical conduit on the reflector support layer. The method further comprises forming a reflector support by etching the reflector support layer from the first substrate surface. The reflector support is mechanically coupled to the support frame and the reflector. The reflector support is movable such that the reflector is movable substantially perpendicularly to the first substrate surface.

According to another aspect of the present invention, a method of fabricating a module for at least partially intercepting a light beam propagating along a beam path comprises providing a substrate comprising single crystal silicon, a first substrate surface, a second substrate surface, and an etch stop layer below the first substrate surface. The method further comprises providing a reflector support layer comprising the etch stop layer. The method further comprises forming a support frame and at least one reflector by etching the substrate from the second substrate surface to the etch stop layer. The method further comprises forming at least one electrical conduit on the reflector support layer. The method further comprises forming a reflector support by etching the reflector support layer from the first substrate surface. The reflector support is mechanically coupled to the support frame and the reflector. The reflector support is movable such that the reflector is movable substantially perpendicularly to the first substrate surface.

According to another aspect of the present invention, a method of fabricating a device on a substrate, where the device comprises at least one fragile component, comprises providing the substrate and forming the device on the substrate. The method further comprises forming a conformal layer on the device by depositing a polymeric material in a vapor phase onto the substrate. The method further comprises dicing and separating the substrate into a plurality of chips. At least one chip contains the device, and the conformal layer provides structural support for the fragile component of the device. The method further comprises removing the conformal layer from the device subsequently to dicing the substrate into the plurality of chips.

According to another aspect of the present invention, a method of fabricating a module for at least partially intercepting a light beam propagating along a beam path comprises providing a single crystal silicon substrate with a first substrate surface and a second substrate surface. The method further comprises forming a reflector support layer on the first substrate surface. The method further comprises forming a support frame and at least one reflector by etching the substrate from the second substrate surface. The method further comprises forming at least one electrical conduit on the reflector support layer. The method further comprises forming a conformal layer by depositing a polymeric material in a vapor phase onto the substrate from the second substrate surface. The method further comprises forming a reflector support by etching the reflector support layer. The reflector support is mechanically coupled to the support frame and the reflector. The reflector support is movable such that the reflector is movable substantially perpendicularly to the first substrate surface.

BRIEF DESCRIPTION OF THE DRAWINGS

FIGS. 1 and 2 schematically illustrate an apparatus for at least partially intercepting a plurality of light beams propagating along a respective plurality of beam paths in accordance with an embodiment of the present invention.

FIG. 12 schematically illustrates one embodiment of the apparatus comprising a (5×5) array configured to switch at least one light beam from a beam path to a second beam path.

FIG. 13 schematically illustrates one embodiment of the apparatus which can be used as an optical add/drop multiplexer (OADM) with a maximum of five light beams.

DETAILED DESCRIPTION OF THE PREFERRED EMBODIMENT

Figure 3:
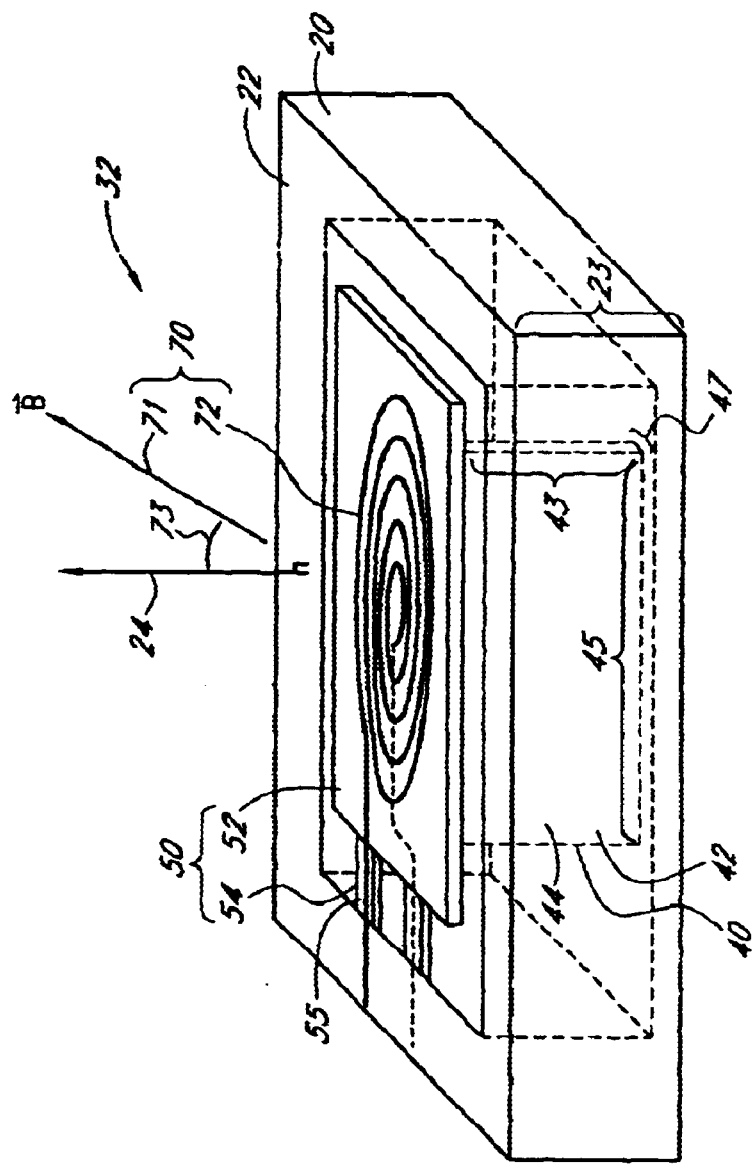
FIGS. 3 and 4 schematically illustrate a module for at least partially intercepting a light beam propagating along a beam path in accordance with an embodiment of the present invention.

FIGS. 1 and 2 schematically illustrate an apparatus 10 for at least partially intercepting a plurality of light beams 12 propagating along a respective plurality of beam paths 14 in accordance with an embodiment of the present invention. The apparatus 10 comprises a single crystal silicon substrate 20 comprising a substrate surface 22 with a surface normal direction 24. The apparatus 10 further comprises an array 30 comprising a plurality of modules 32.

Figure 4:
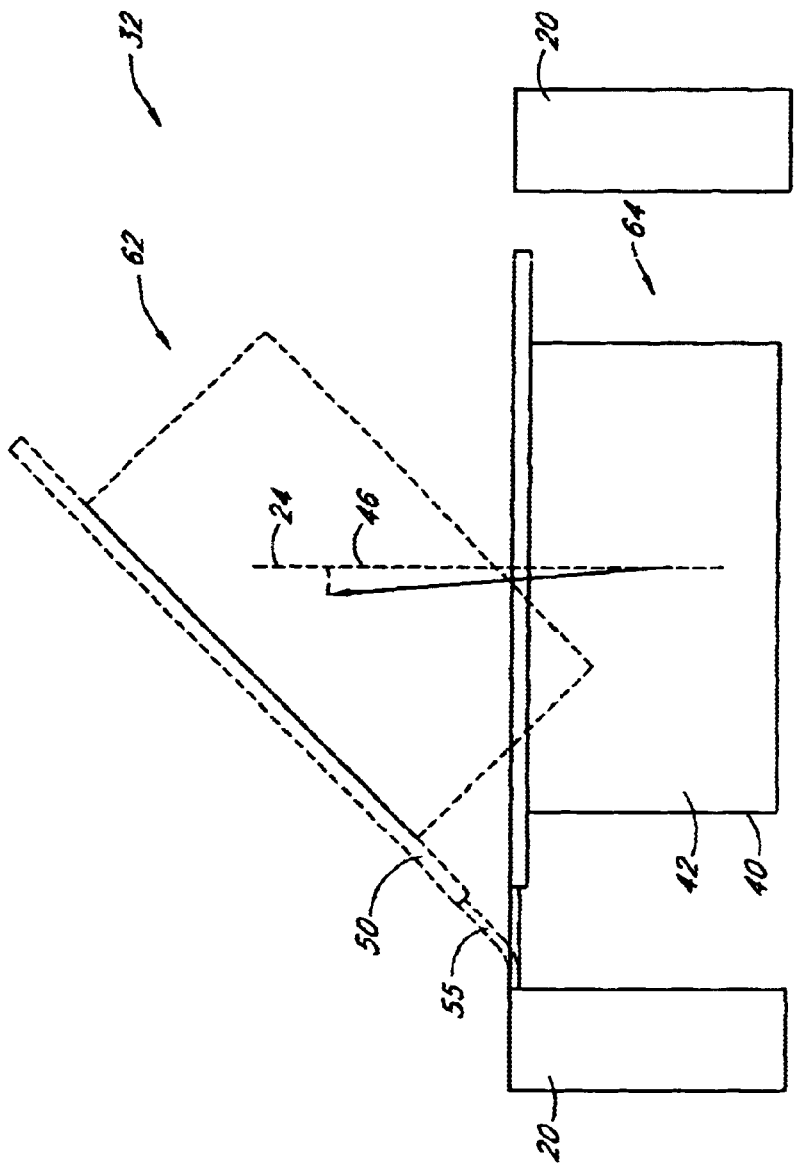

Each of the modules 32, schematically illustrated in FIGS. 3 and 4, comprises a reflector 40 comprising single crystal silicon and a reflector surface 42 lying in a reflector plane 44 substantially perpendicular to the substrate surface 22. Each of the modules 32 further comprises a reflector support 50 which mounts the reflector 40 to move substantially within the reflector plane 44 with a displacement component 46 along the surface normal direction 24 of the substrate surface 22. Each of the modules 32 further comprises a reflector driver 60 responsive to electrical current to selectively move the reflector 40 between a first position 62 in which the reflector 44 intercepts at least a portion of one of the beam paths 14 and a second position 64 in which the reflector 44 does not intercept the portion of one of the beam paths 14. At least a portion of the reflector driver 60 is mounted to the reflector support 50 and is conductive to electrical current. The reflector 40 moves to the first position 62 when electrical current flows therethrough and moves to the second position 64 when electrical current flow ceases, whereby the movement of the reflectors 40 is individually addressable.

In certain embodiments, the wavelengths of the plurality of light beams 12 are in the visible portion of the electromagnetic spectrum, typically between approximately 400 nm and approximately 800 nm. In alternative embodiments, wavelengths of the plurality of light beams 12 are in the infrared portion of the electromagnetic spectrum, between approximately 1200 nm and approximately 1600 nm. In addition, in certain embodiments, the light beams 12 are polarized, while in certain other embodiments, the light beams 12 are unpolarized. Persons skilled in the art are able to select appropriate wavelengths and polarizations of the light beams 12 in accordance with embodiments of the present invention.

The plurality of light beams 12 propagate along a respective plurality of beam paths 14. In the embodiment schematically illustrated in FIGS. 1 and 2, the beam paths 14 are substantially parallel to the substrate surface 22 and are substantially parallel to one another. Furthermore, the beam paths 14 are spaced from the substrate surface 22 in the direction of the surface normal 24 such that the light beam 12 is not occluded by the substrate 20. The beam paths 14 are spaced from one another such that each module 32 is below only one of the beam paths 14. The beam paths 14 are separated from one another by a distance of preferably between approximately 0.3 mm to approximately 10 mm, more preferably between approximately 0.75 mm to approximately 4 mm, and most preferably between approximately 1 mm to approximately 2 mm. In other embodiments, the beam paths 14 can be spaced from the substrate surface 22 in the direction opposite to the surface normal 24. In such embodiments, the beam paths 14 can be within the substrate 20 or can be below the substrate 20. Persons skilled in the art can configure the beam paths 14 in accordance with embodiments of the present invention.

In the embodiment schematically illustrated in FIGS. 1 and 2, which is configured for optical switching, the second beam paths 16 are also substantially parallel to the substrate surface 22, and substantially parallel to one another. In addition, the second beam paths 16 intersect the beam paths 14 and are co-planar with the beam paths 14. As described more fully below, in embodiments in which the reflector planes 44 are oriented at approximately 45° to the beam paths 14, the second beam paths 16 are substantially perpendicular to the beam paths 14. Furthermore, the second beam paths 16 are spaced from one another such that each module 32 is below only one of the second beam paths 16. The second beam paths 16 are separated from one another by a distance of preferably between approximately 0.3 mm to approximately 10 mm, more preferably between approximately 0.75 mm to approximately 4 mm, and most preferably between approximately 1 mm to approximately 2 mm.

The single crystal silicon substrate 20 comprises a substrate surface 22 with a surface normal direction 24. In certain embodiments, the single crystal silicon substrate 20 comprises a portion of a single crystal silicon wafer, the wafer having a thickness preferably between approximately 10 $\mu$m and approximately 1000 $\mu$m, more preferably between approximately 200 $\mu$m and approximately 800 $\mu$m, and most preferably between approximately 400 $\mu$m and approximately 600 $\mu$m. In certain embodiments, the substrate surface 22 has a {110} crystallographic orientation. In certain other embodiments, the substrate surface 22 has a {100} crystallographic orientation. More generally, in other embodiments, the substrate surface 22 comprises at least one plateau surface region, with each plateau surface region having a {110} or {100} crystallographic orientation. As used herein, the surface normal direction 24 is defined as the perpendicular direction away from the substrate surface 22. In certain embodiments, the substrate 20 also has a second substrate surface 25 which is generally parallel to the substrate surface 22. Persons skilled in the art are able to provide a single crystal silicon substrate 20 with a substrate surface 22 having a surface normal direction 24 in accordance with embodiments of the present invention.

The apparatus 10 of the embodiment schematically illustrated in FIGS. 1 and 2 has a (5×5) array 30 comprising twenty-five modules 32 to at least partially intercept five light beams 12 or channels. Each module 32 is positioned below the intersection of one of the beam paths 14 and one of the second beam paths 16. The array 30 is oriented so that the rows and columns of modules 32 are positioned along the beam paths 14 and second beam paths 16. This embodiment, which has five modules 32 for each light beam 12, can switch at least a portion of the light beam 12 from the beam path 14 to five separate second beam paths 16. More generally, similar configurations of (M×N) modules 32 can be utilized to switch light beams 12 from M beam paths 14 to N second beam paths 16, where M and N are integers which, in various embodiments, range from 1 to 64. Furthermore as described more fully below, the reflector 40 of each module 32 of the embodiment schematically illustrated in FIGS. 1 and 2 is oriented at 45° with respect to the beam path 14, which is particularly conducive to operating as an optical add/drop multiplexer (OADM).

Figure 5A:
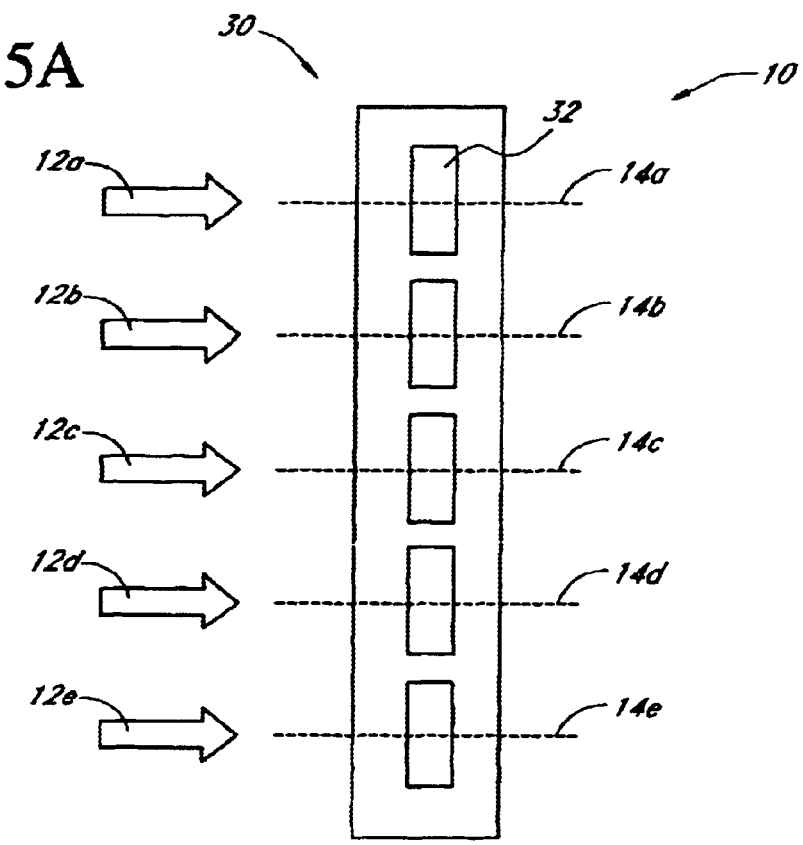
FIGS. 5A and 5B schematically illustrate an embodiment of the apparatus in which only attenuation, and not switching is warranted.
Figure 5B:
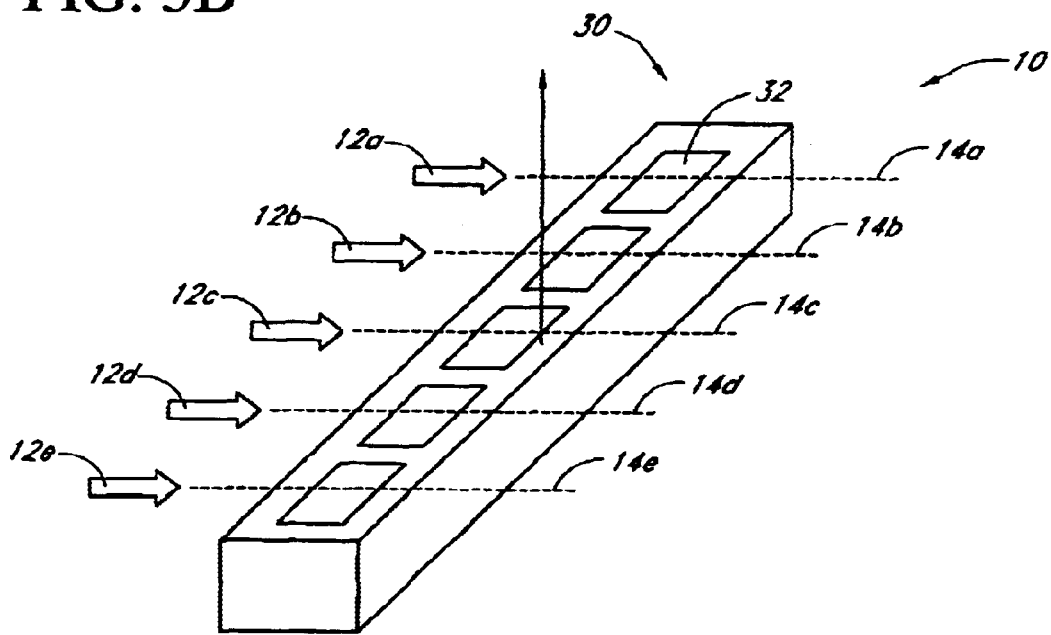

Alternatively, in other embodiments in which only attenuation, and not switching is warranted, the apparatus 10 can comprise an array 30 with only one module 32 for each light beam 12, as schematically illustrated in FIGS. 5A and 5B. For example, in embodiments in which there are five light beams 12 to be attenuated, there are five modules 32 with one module 32 positioned below each of the beam paths 14. Furthermore as described more fully below, the reflector 40 of each module 32 of the embodiment schematically illustrated in FIGS. 5A and 5B is to be substantially perpendicular to the beam path 14. In such an embodiment, each module 32 can intercept at least a portion of the corresponding light beam 12 from the beam path 14. Persons skilled in the art can configure an array 30 with an appropriate number and configuration of modules 32 to at least partially intercept light beams 12 in accordance with embodiments of the present invention.

As schematically illustrated in FIGS. 3 and 4, each of the modules 32 comprises a reflector 40 comprising single crystal silicon and a reflector surface 42 lying in a reflector plane 44 substantially perpendicular to the substrate surface 22. As used herein, the term "reflector" is used to denote a body which reflects a portion of the electromagnetic radiation incident on the body. As is described more fully below, in certain embodiments, the reflector 40 is fabricated from the single crystal silicon substrate 20, so the reflector 40 comprises a portion of the single crystal silicon substrate 20. In such embodiments, the reflector surface 42 has a {111} crystallographic orientation when the substrate surface 22 has a {110} crystallographic orientation. Also, in such embodiments, the reflector surface 42 has a {100} crystallographic orientation when the substrate surface 22 has a {100} crystallographic orientation. The {111} crystallographic orientation of the reflector surface 42 provides a mechanically robust, smooth, and low stress surface which is preferable over polycrystalline reflector surfaces which have a high degree of stress, often resulting in inherent curvature of the surface.

In certain embodiments, the reflector 40 further comprises a metal layer formed as part of the reflector surface 42. Examples of materials for the metal layer include, but are not limited to, chromium, gold, titanium, aluminum, silver, platinum, or combinations of these materials. The thickness of the metal layer is preferably between approximately 10 Å to approximately 1000 Å, more preferably between approximately 100 Å to approximately 900 Å, and most preferably between approximately 200 Å to approximately 600 Å. In certain embodiments, the reflector surface 42 reflects substantially all of the incident light beam 12. In other embodiments, the reflector surface 42 reflects a portion of the incident light beam 12 and transmits a second portion of the incident light beam 12. As described more fully below, the thickness of the metal layer can be selected to provide a desired reflectivity and transmittance of the incoming optical power incident on the reflector 40.

Due to the fabrication process described below and the crystallographic directions of the single crystal silicon substrate 20, the reflector 40 schematically illustrated in FIGS. 3 and 4 has a generally rectangular shape. Furthermore, the height 43 of the reflector 40 in such embodiments is constrained to be less than or equal to the thickness 23 of the silicon substrate 20, while there is no such constraint on the width 45 of the reflector 40. The height 43 of the reflector 40 is preferably between approximately 10 $\mu$m and approximately 1000 $\mu$m, more preferably between approximately 200 $\mu$m and approximately 800 $\mu$m, and most preferably between approximately 400 $\mu$m and approximately 600 $\mu$m. Typically, the width 45 of the reflector 40 is approximately 700 $\mu$m, and the thickness 47 of the reflector 40 is typically between approximately 20 $\mu$m and approximately 30 $\mu$m. Other widths and thicknesses of the reflector 40 are also compatible with embodiments of the present invention.

The reflector support 50 mounts the reflector 40 to move substantially within the reflector plane 44 with a displacement component 46 along the surface normal direction 24 of the substrate surface 22. In the embodiment schematically illustrated in FIGS. 3 and 4, the reflector support 50 comprises a flap 52 and at least one coupler 54 which mechanically couples the flap 52 to the substrate 20. The flap 52 is generally flat and parallelogram-shaped, and can be positioned substantially parallel to the substrate surface 22 as schematically illustrated in FIG. 3. In certain embodiments, the shape of the flap 52 is defined by the crystallography of the single crystal silicon substrate 20 and the fabrication process. The dimensions of the sides of the flap 52 are preferably between approximately 0.2 mm and approximately 10 mm, more preferably between approximately 0.5 mm and approximately 5 mm, and most preferably between approximately 1 mm and approximately 3 mm. The thickness of the flap 52 is typically between approximately 3 $\mu$m and approximately 50 $\mu$m, but other thicknesses are also compatible with embodiments of the present invention.

In certain embodiments, the flap 52 is at least partially fabricated from the single crystal silicon substrate 20, so the flap 52 comprises single crystal silicon. In other embodiments, the flap 52 comprises other materials which can include, but are not limited to, polycrystalline silicon, amorphous silicon, silicon nitride, silicon carbide, metal, or a combination of these materials. Persons skilled in the art can select appropriate materials for the flap 52 in accordance with various embodiments of the present invention.

Figure 6:
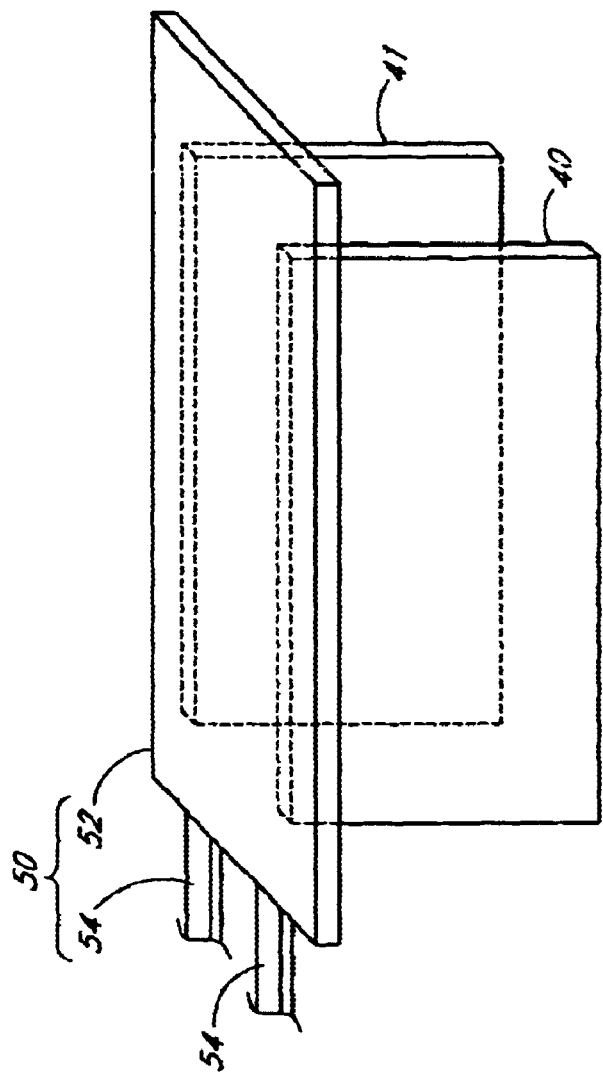
FIG. 6 schematically illustrates a module comprising a compensation structure.

In certain embodiments, the module 32 further comprises a compensation structure 41 which comprises single crystal silicon, as schematically illustrated in FIG. 6. In this embodiment, the compensation structure 41 is similar to the reflector 40 in that both the compensation structure 41 and the reflector 40 have the same general dimensions and comprise the same general materials. In addition, as is described more fully below, the compensation structure 41 is fabricated along with the reflector 40. In certain embodiments, the compensation structure 41 can serve as a counterbalancing mass which balances the mass of the reflector 40 to provide more symmetric dynamics of the reflector support 50 and as a thermal mass to provide more symmetric response of the reflector support 50 to thermal fluctuations. In such embodiments, the compensation structure 41 and reflector 40 are positioned symmetrically with respect to an axis of symmetry of the reflector support 50. In addition, in other embodiments, the compensation structure 41 comprises a second reflector surface which can be utilized to deflect a light beam 12, as is described more fully below.

In the embodiment schematically illustrated in FIG. 3, the flap 52 is coupled to the substrate 20 by a pair of couplers 54. The presence of more than one coupler 54 helps to ensure rigidity to keep the reflector surface 42 substantially perpendicular to the substrate surface 22. In embodiments in which the couplers 54 are at least partially fabricated from the single crystal silicon substrate 20, the couplers 54 comprise single crystal silicon. In other embodiments, the couplers 54 comprise other materials which can include, but are not limited to, polycrystalline silicon, amorphous silicon, silicon nitride, silicon carbide, metal, or a combination of these materials.

In the embodiment schematically illustrated in FIGS. 3 and 4, each coupler 54 comprises a cantilever 55 which couples the flap 52 to the substrate 20. In such an embodiment, the flap 52 is movable relative to the substrate 20, as schematically illustrated in FIG. 4. As the flap 52 is moved away from its equilibrium position, the cantilevers 55 provide a restoring force in a direction to return the flap 52 to its equilibrium position. In the embodiment schematically illustrated in FIGS. 3 and 4, the cantilevers 55 are not bent when the flap 52 is in its equilibrium position.

Figure 7A:
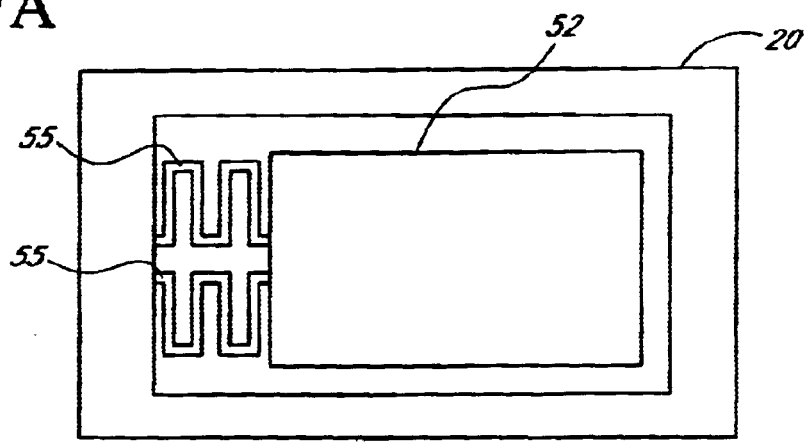
FIG. 7A schematically illustrates a cantilever with a serpentine configuration which couples the flap to the substrate.
Figure 7B:
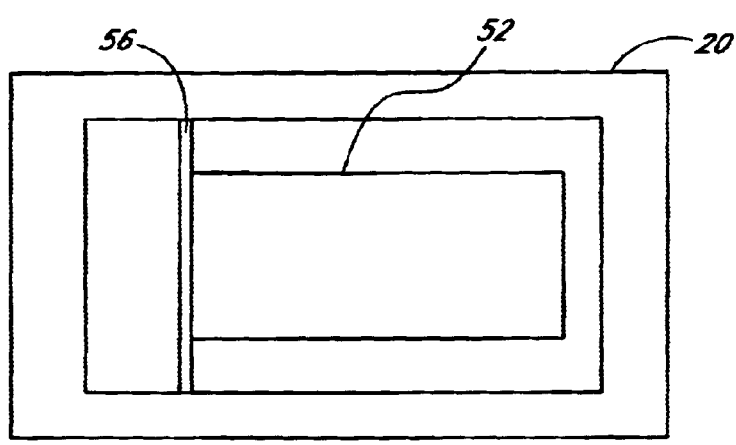
FIGS. 7B and 7C schematically illustrate two types of torsional springs which couples the flap to the substrate.
Figure 7C:
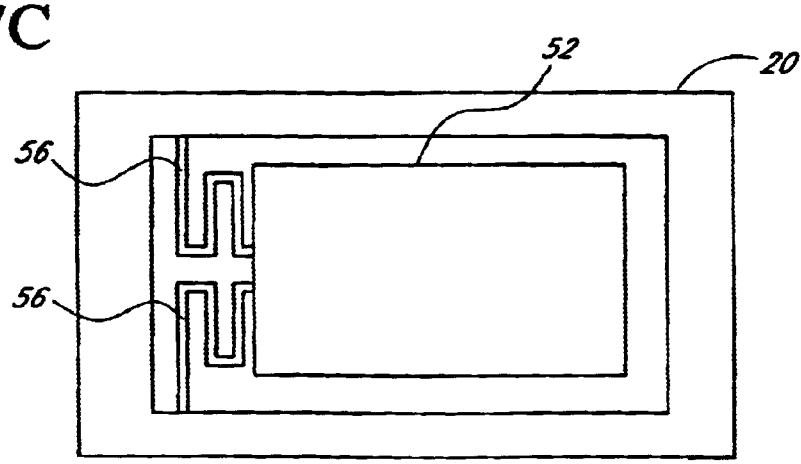

Alternatively, as schematically illustrated in FIGS. 7A, 7B, and 7C, the coupler 54 can have other configurations. FIG. 7A schematically illustrates a cantilever 55 with a serpentine configuration which couples the flap 52 to the substrate 20. FIGS. 7B and 7C schematically illustrate two types of torsional springs 56 which couples the flap 52 to the substrate 20, a straight configuration (FIG. 7B), and a serpentine configuration (FIG. 7C). In each of these embodiments, as the flap 52 is moved away from its equilibrium position, the couplers 54 provides a restoring force in a direction to return the flap 52 to its equilibrium position. In the embodiments schematically illustrated in FIGS. 3, 4, 7A, 7B, and 7C, the flap 52 is substantially parallel to the substrate surface 22 when in its equilibrium position. Alternatively, in other embodiments, the flap 52 is tilted at an angle relative to the substrate surface 22 when the flap 52 is in its equilibrium position.

As schematically illustrated in FIGS. 3 and 4, the reflector plane 44 is substantially perpendicular to the flap 52 and the flap 52 is coupled to the substrate 20 such that the flap 52 is rotatable about an axis of rotation which is parallel with the substrate surface 22 and perpendicular to the reflector plane 44. In this way, the reflector 40 is mounted to the flap 52 of the reflector support 50 such that the reflector 40 moves substantially within the reflector plane 44. The movement of the reflector 40 can be described as having a displacement vector, and this displacement vector has a displacement component 46 along the surface normal direction 24 of the substrate surface 22. Besides the displacement vector, this movement of the reflector 40 also comprises a rotation of the reflector 40, as schematically illustrated in FIG. 4.

Figure 8:
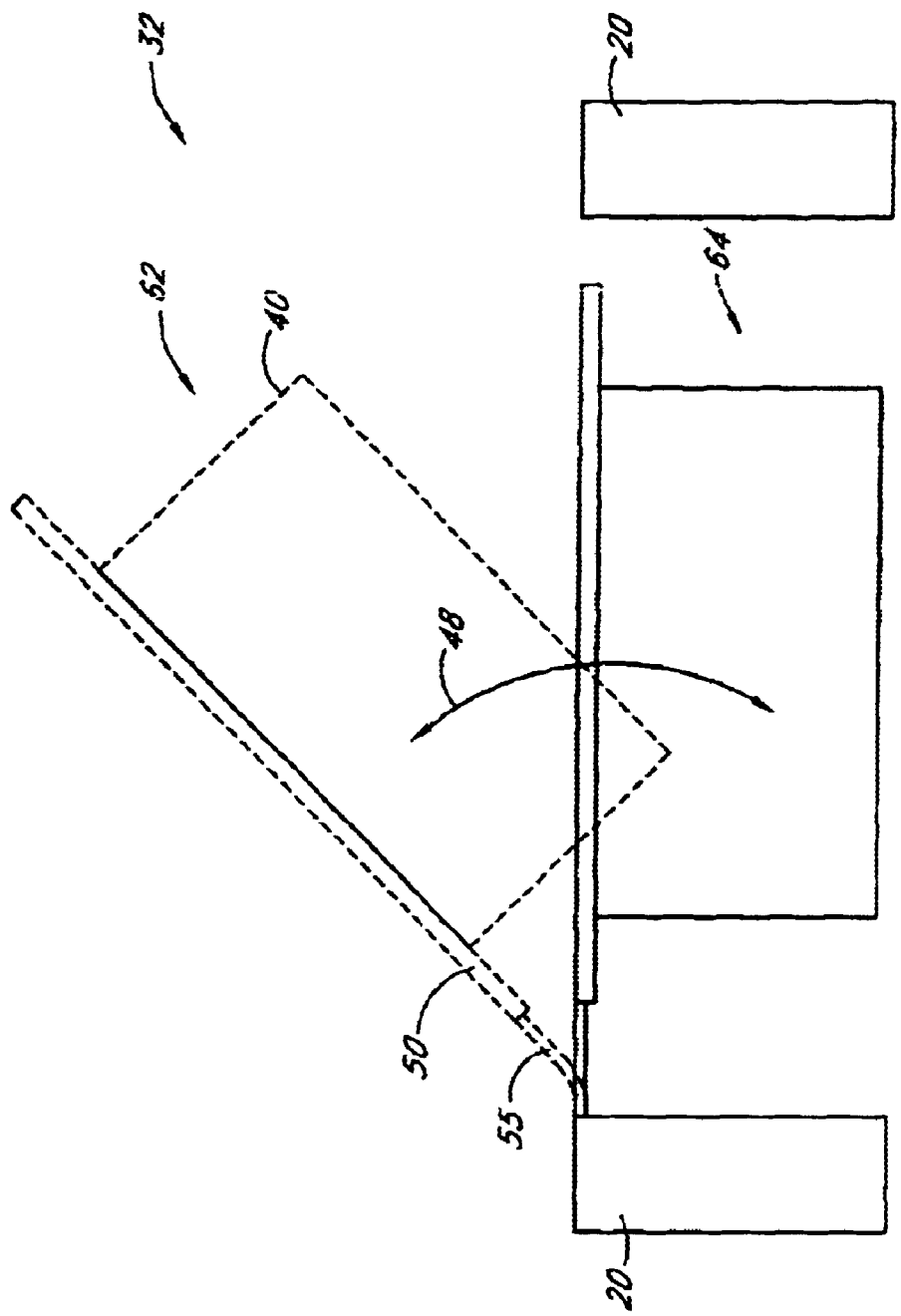
FIG. 8 schematically illustrates the movement of the reflector along a curved path lying substantially in the reflector plane.

This movement of the reflector 40 can also be described as moving along a curved path 48 lying substantially in the reflector plane 44, as schematically illustrated in FIG. 8. By following this curved path 48, the reflector 40 rotates about an axis substantially perpendicular to the reflector plane 44. In certain other embodiments, the curved path 48 can also include a displacement of the reflector 40 which is dependent on the particular deflection experienced by the coupler 54.

The reflector driver 60 is responsive to electrical current to selectively move the reflector 40 between a first position 62 and a second position 64. The reflector driver 60 comprises a portion which is mounted to the reflector support 50 and is conductive to electrical current. In the embodiment schematically illustrated in FIG. 3, the reflector driver 60 comprises a magnetic actuator 70 which comprises a magnetic field 71 generated externally from the array 30 and an electrical conduit 72 mechanically coupled to the reflector support 50. The magnetic field 71 is generated by a magnet (not shown) which can be a permanent magnet or an electromagnet. For example, the substrate 20 can be placed in the airgap between the poles of a magnetic yoke, with the pole shapes optimized to inprove the uniformity of the magnetic field. The magnetic field strength depends somewhat on the design and spring constants of the module 32, and in certain embodiments, the magnetic field strength is approximately 5000 gauss.

In certain embodiments, the poles of the magnet are spaced from the substrate surface 22 such that the magnetic field 71 has a component perpendicular to the substrate surface 22 and substantially uniform in a region above the array 30. The magnetic field 71 of such embodiments forms an angle 73 with the surface normal direction 24 of the substrate surface 22 and has a component parallel to the reflector surface 42. In alternative embodiments, the substrate 20 can be placed in the airgap such that the magnetic field 71 is parallel to the substrate surface 22. In still other embodiments, individual north-south pole pairs can be located under or above each flap 52 to generate a separate magnetic field 71 for each module 32.

In the embodiment schematically illustrated in FIG. 3, the electrical conduit 72 is fabricated on the flap 52 and extends across the couplers 54. In certain embodiments, such as the embodiment schematically illustrated in FIG. 3, the electrical conduit 72 has a generally spiral configuration and has two conductive layers on top of one another, separated by an insulating layer. Electrical current enters and flows through the spiralpatterned first conductive layer, and exits through the second conductive layer. The electrical current can be supplied from an off-substrate source by using standard electrical connections such as bond wires and bond pads located on the substrate 20. Other embodiments can utilize electrical conduits 72 with other configurations.

Figure 9:
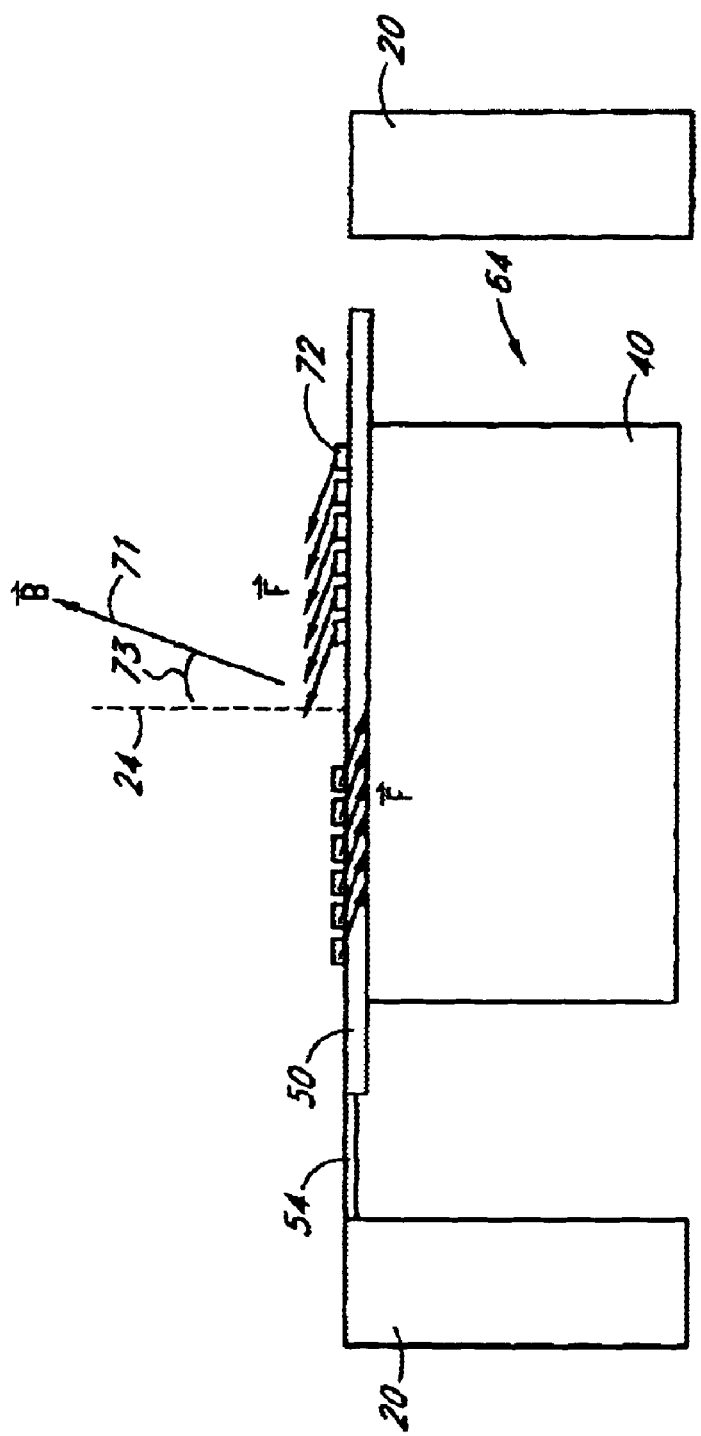
FIG. 9 schematically illustrates a reflector driver comprising a magnetic actuator.

By applying the magnetic field 71 and flowing an electrical current through the electrical conduit 72, as schematically illustrated in FIG. 9, the magnetic actuator 70 generates a torque which moves the reflector 40 between the first position 62 and second position 64. An electrical current flowing through the electrical conduit 72 interacts with the externally-applied magnetic field 71 to create forces on the electrical conduit 72 which are perpendicular to both the magnetic field 71 and the electrical conduit 72 at each point along the electrical conduit 72. These forces are given by the equation: F=I×B, where I is the current vector through the electrical conduit 72 and B is the magnetic field vector 71 and I×B denotes the vector cross product of the current vector and the magnetic field vector. For the embodiment schematically illustrated in FIGS. 3 and 9, the sum of these forces on the electrical conduit 72 is substantially zero. However, the sum of the torques generated by these forces about the axis of rotation is non-zero because the forces are applied to the electrical conduit 72 at different distances from the axis of rotation. In this way, a non-zero torque is produced by the forces generated when electrical current flows through the electrical conduit 72, thereby deflecting the flap 52 and reflector 40. The forces produced by the electrical current will deflect the flap 52 either up or down, depending on the direction of the electrical current and the direction of the magnetic field 71. The deflection reaches a position at which the torque produced by the restoring force of the couplers 54 equals the torque produced by the forces generated by the flow of electrical current. By adjusting the magnitude of the electrical current, and thereby adjusting the torque applied by the reflector driver 60, the amount of deflection of the flap 52 and reflector 40 can be controlled. For certain embodiments of fiber optic switching applications, the deflection is determined by the beam size, typically between 5 $\mu$m and 600 $\mu$m, and power consumption is typically on the order of tens of milliwatts.

In other embodiments, the module 32 can comprise more than one electrical conduit 72 on the flap 52. For example, the flap 52 can have two electrical conduits 72. In such embodiments, each electrical conduit 72 can have a separate electrical current applied to it, thereby providing additional control on the forces applied to the flap 52 to more precisely control the movement of the flap 52 and reflector 40.

Figure 10:
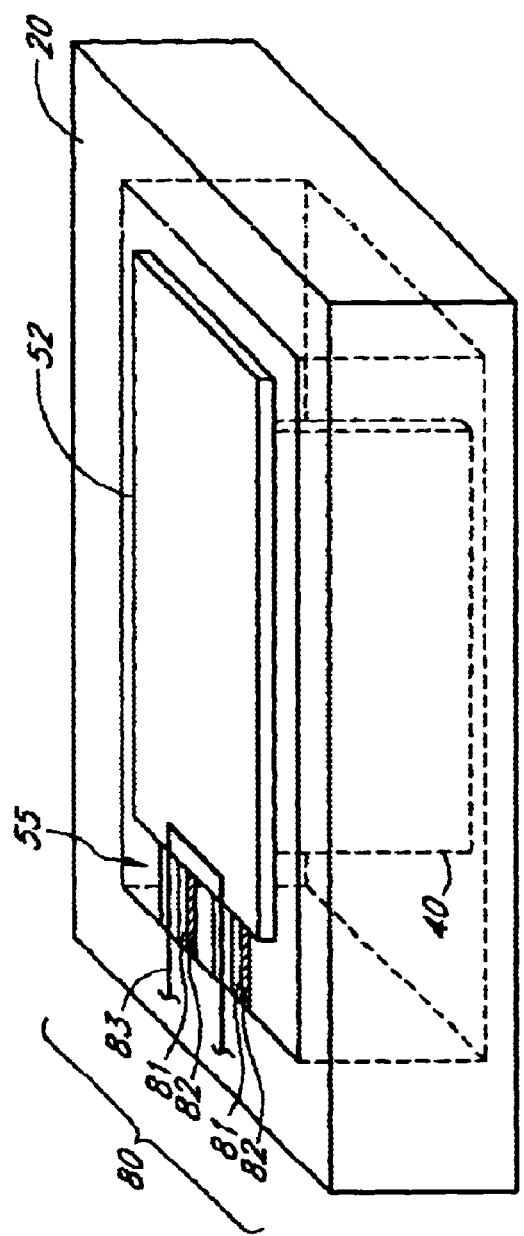
FIG. 10 schematically illustrates a reflector driver comprising a thermal actuator.

In other embodiments, such as schematically illustrated in FIG. 10, the reflector driver 60 comprises a thermal actuator 80 which comprises a first material 81 and a second material 82 which expand by differing amounts in response to thermal energy generated by the electrical current. Expressed differently, the first material 81 has a different thermal coefficient of expansion than does the second material 82. Examples of materials which can be utilized as the first material 81 and second material 82 include, but are not limited to, single crystal silicon, polycrystalline silicon, silicon nitride, metal, or a combination of these materials.

Figure 11A:
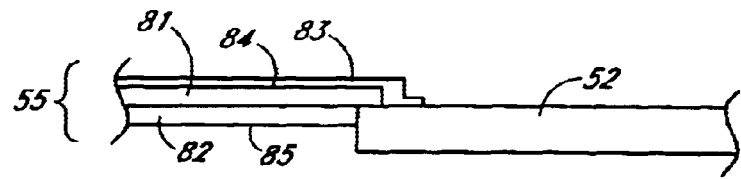
FIG. 11A schematically illustrates a thermal actuator comprising a first material and a second material.
Figure 11B:
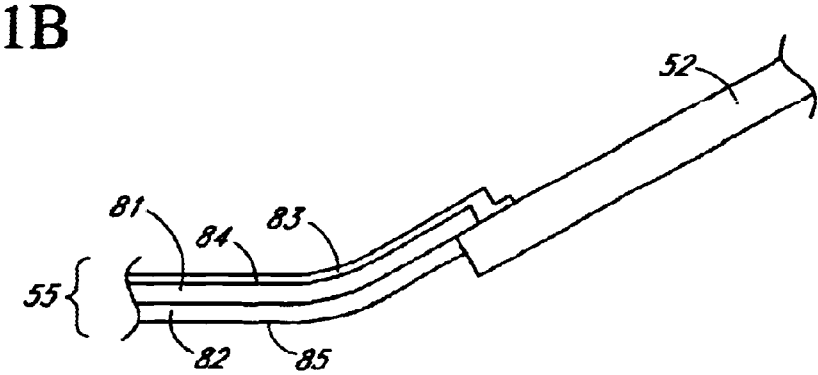
FIG. 11B schematically illustrates the displacement of the thermal actuator upon heating where the first material has a lower thermal coefficient of expansion than that of the second material.
Figure 11C:
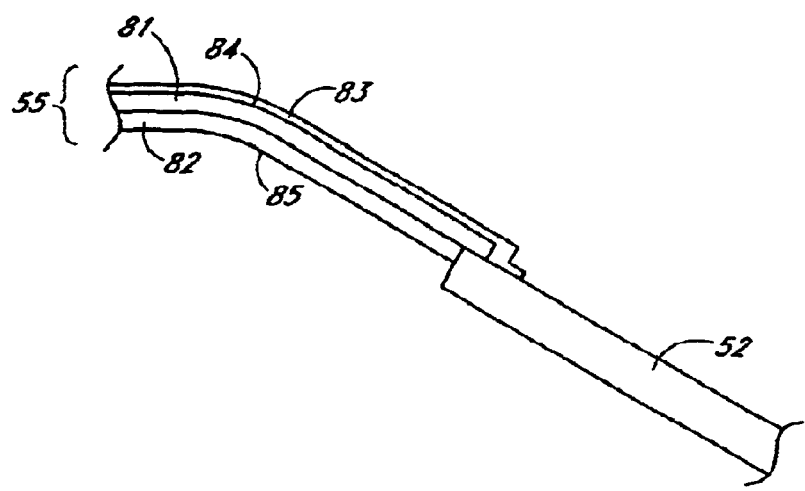
FIG. 11C schematically illustrates the displacement of the thermal actuator upon heating where the first material has a higher thermal coefficient of expansion than that of the second material.

In the embodiment schematically illustrated in FIG. 10, the thermal actuator 80 comprises a pair of cantilevers 55, such as described above in relation to the reflector support 50, and at least one electrical conduit 83. In such embodiments, the cantilevers 55 serve as part of both the reflector support 50 and the reflector driver 60. Each cantilever 55 is configured to have a first portion 84 comprising the first material 81, and a second portion 85 comprising the second material 82. The first portion 84 and second portion 85 are configured in relation to one another to provide a displacement of the flap 52 as described herein. As schematically illustrated in FIGS. 11A–11C, in one embodiment, the first portion 84 is on top of the second portion 85, and both the first portion 84 and second portion 85 are coupled to the substrate 20 and the flap 52. Other configurations of the first portion 84 and second portion 85 are compatible with embodiments of the present invention.

The electrical conduit 83 is configured to generate thermal energy via joule heating upon flowing an electrical current flowing therethrough. Furthermore, the electrical conduit 83 is configured such that the the cantilevers 55 are exposed to the thermal energy generated by the electrical current. In certain embodiments, such as the embodiment schematically illustrated in FIGS. 11A–11C, the electrical conduit 83 comprises a metal layer on the flap 52 and the couplers 54. Examples of materials for the electrical conduit 83 include, but are not limited to, chromium, gold, titanium, aluminum, copper, nickel, or combinations of these materials. Alternatively in other embodiments, the electrical conduit 83 comprises the cantilevers 55 which are electrically conductive. In such an embodiment, electrical current can flow through the cantilevers 55 themselves. The electrical current can be supplied from an off-substrate source by using standard electrical connections such as bond wires and bond pads located on the substrate 20.

In embodiments in which the cantilevers 55 are initially straight when not heated, as schematically illustrated in FIG. 11A, heating the cantilevers 55 by applying electrical current to the electrical conduit 83 will curve the cantilevers 55 out of the plane of the substrate surface 22, thereby raising (FIG. 11B) or lowering (FIG. 11C) the flap 52 and reflector 40 from their original positions. In the embodiment schematically illustrated in FIG. 11B, the raising of the flap 52 is achieved by using a first material 81 which has a lower thermal coefficient of expansion than that of the second material 82. In the embodiment schematically illustrated in FIG. 11C, the lowering of the flap 52 is achieved by using a first material 81 which has a higher thermal coefficient of expansion than that of the second material 82. Similarly, for embodiments in which the cantilevers 55 are initially curved out of the plane of the substrate surface 22, (e.g., due to intrinsic stresses in the cantilevers 55) applying electrical current to the electrical conduit 83 can straighten the cantilevers 55.

By selectively applying electrical current to the reflector driver 60 of selected modules 32, the movement of the reflectors 40 is individually addressable. The direction and magnitude of the displacement of the reflector 40 is dependent on the configuration of the first portion 84 and second portion 85 of the cantilevers 55 and on the difference of the thermal coefficients of expansion for the first material 81 and second material 82. When the electrical current is removed and the cantilevers 55 are permitted to cool, the reflector 40 returns to its original position. By adjusting the magnitude of the electrical current, the amount of deflection of the flap 52 and reflector 40 can be controlled. For certain embodiments of fiber optic switching applications, the deflection is determined by the beam size, typically 5 μm to 600 μm, and power consumption is typically on the order of tens of milliwatts.

The reflector driver 60 of a given module 32 selectively moves the reflector 40 of the module 32 between a first position 62 and a second position 63. When in the first position 62, the reflector 40 intercepts at least a portion of one of the beam paths 14. When in the second position 64, the reflector 40 does not intercept the portion of one of the beam paths 14. The reflector 40 moves to the first position 62 when electrical current flows through the conductive portion of the reflector driver 60, whereby the movement of the reflectors 40 is individually addressable. The reflector 40 moves to the second position 64 when electrical current ceases to flow through the conductive portion of the reflector driver 60. In certain embodiments, the reflector 40 in the first position 62 is deflected out of the substrate surface 22, and the second position 64 is the equilibrium position of the reflector 40, as schematically illustrated in FIG. 4.

FIG. 12 schematically illustrates one embodiment in which the apparatus 10 comprises a (5×5) array 30 configured to switch at least one light beam 12 from a beam path 14 to a second beam path 16. In the embodiment schematically illustrated in FIG. 12, the plurality of light beams 12 are propagating along the plurality of beam paths 14, which are configured to be above and substantially parallel to the substrate surface 22. By selectively addressing one of the five reflectors 40aa–40ae corresponding to the beam path 14a of the light beam 12a, the light beam 12a can be deflected into one of five second beam paths 16a–16e. For example, when the reflector 40ab is in the first position 62, and reflectors 40aa, 40ac–40ae are each in the second position 64, the reflector 40ab completely intercepts the beam path 14a, and deflects the light beam 12a into the second beam path 16b. Also, in certain embodiments, the size of the reflector 40 is larger than the spot size of the light beam 12, thereby requiring less precision in the positioning of the reflector 40 to completely intercept the beam path 14.

Similarly, one reflector 40 corresponding to each of the other light beams 12 can be moved into the first position 62 to completely intercept each beam path 14 and to deflect each of the light beams 12 into a unique second beam path 16. More generally, at any given time, N reflectors 40 would be moved into the first position 62, each with a unique column and row address, and the other $N^2-N$ reflectors 40 would be in the second position 64. In this way, each of the five light beams 12a–12e propagating along the five beam paths 14a–14e can be selectively deflected utilizing the twenty-five reflectors 40aa–40ee into five unique second beam paths 16a–16e.

Alternatively, the apparatus 10 can be used as an optical add/drop multiplexer (OADM) with a maximum of five light beams 12, as schematically illustrated in FIG. 13. In such an embodiment, one or more of the incoming light beams 12a–12e can be effectively "dropped" from the output of the apparatus 10 by not deflecting the dropped light beam 12 into one of the second beam paths 16a–16e. In addition, an incoming "added" second light beam 90 can propagate along the second beam path 16, effectively replacing the dropped light beam 12. For example, in the embodiment schematically illustrated in FIG. 13, the light beam 12b is dropped and the second light beam 90 is added in its place. By not selectively addressing any of the reflectors 40 corresponding to the beam path 14b, the dropped light beam 12b selected to be removed will continue to propagate along the beam path 14b. In this way, the output from the apparatus 10 has four of the incoming light beams 12a, 12c–12e and the added second light beam 90. This procedure of dropping an incoming light beam 12 and adding another second light beam 90 in its place is termed "optical add/drop multiplexing."

Figure 14:
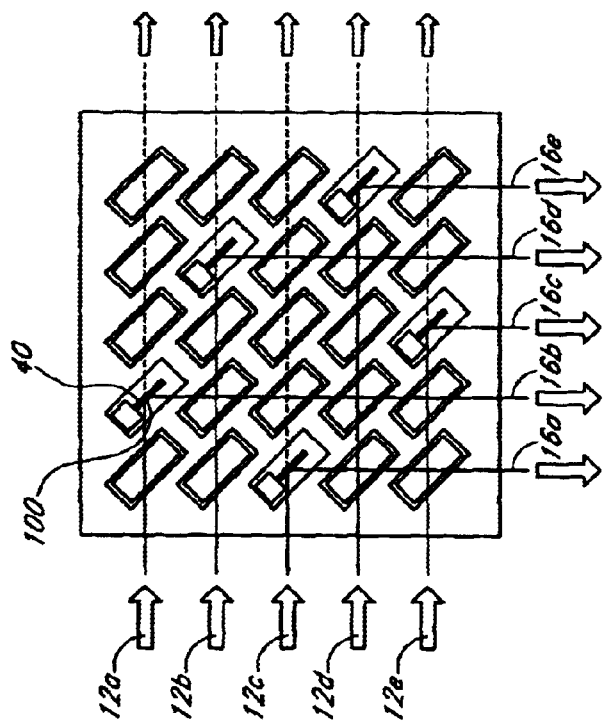
FIG. 14 schematically illustrates an embodiment in which the reflector is configured to transmit a portion of the incoming light beam, thereby switching only the remaining portion of the light beam.

Alternatively, in other embodiments, the reflector 40 is configured to transmit a portion of the incoming light beam 12, thereby switching only the remaining portion of the light beam 12. For example, as schematically illustrated in FIG. 14, one embodiment of the present invention can be used with infrared light beams 12. Because silicon transmits infrared light, each reflector 40 of this embodiment has a metal layer 100 with a thickness which determines the transmittance of the reflector 40 to the infrared light beam 12. The dependence of the reflectance and transmittance of metal layers as a function of layer thickness is described in pages 35.3–35.15 of "Handbook of Optics, Volume II: Devices, Measurements, and Properties," second edition, edited by Michael Bass, published by McGraw-Hill, Inc., which is incorporated herein in its entirety by reference. The thickness of the metal layer 100 is selected to provide a reflector 40 with a selected transmittance and reflectance to the light beam 12. While the reflected portion of the light beam 12 is switched to the second beam path 16, the transmitted portion of the light beam 12 which continues to propagate along the beam path 14 can be sampled to monitor the performance of the apparatus 10.

Figure 15A:
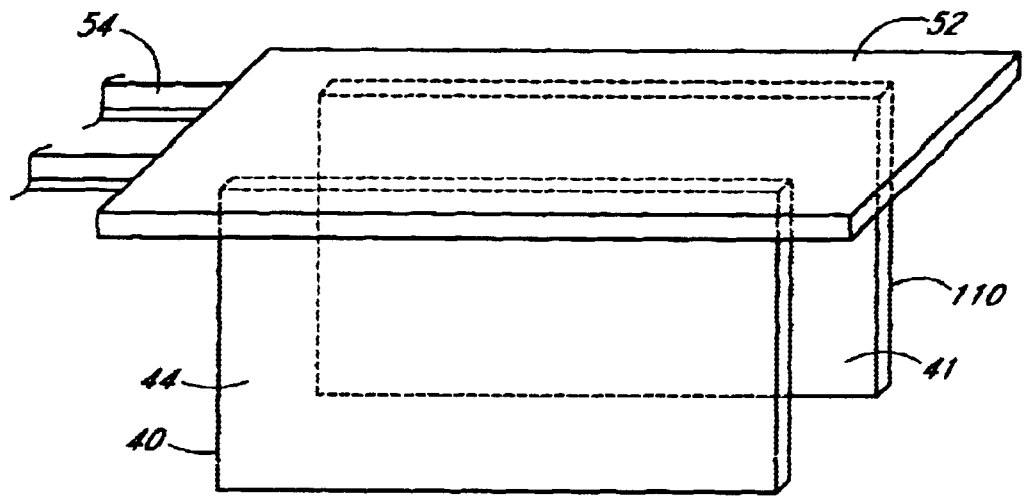
FIG. 15A schematically illustrates an embodiment which has modules which each comprise a compensation structure which comprises a second reflector surface.
Figure 15B:
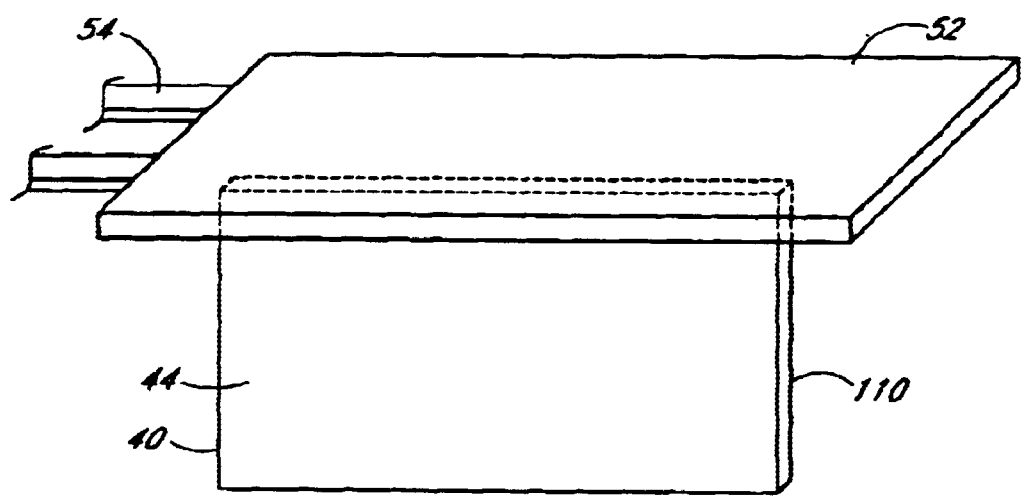
FIG. 15B schematically illustrates an embodiment in which the second reflector surface comprises the surface of the reflector which is opposite the reflector surface.

Other embodiments of the present invention utilize modules 32 which each comprise a second reflector surface 110. Certain embodiments, such as schematically illustrated in FIG. 15A have modules 32 which comprise a compensation structure 41 which comprises a second reflector surface 110. Alternatively as schematically illustrated in FIG. 15B, in other embodiments, the second reflector surface 110 can comprise the surface of the reflector 40 which is opposite the reflector surface 42.

Figure 16:
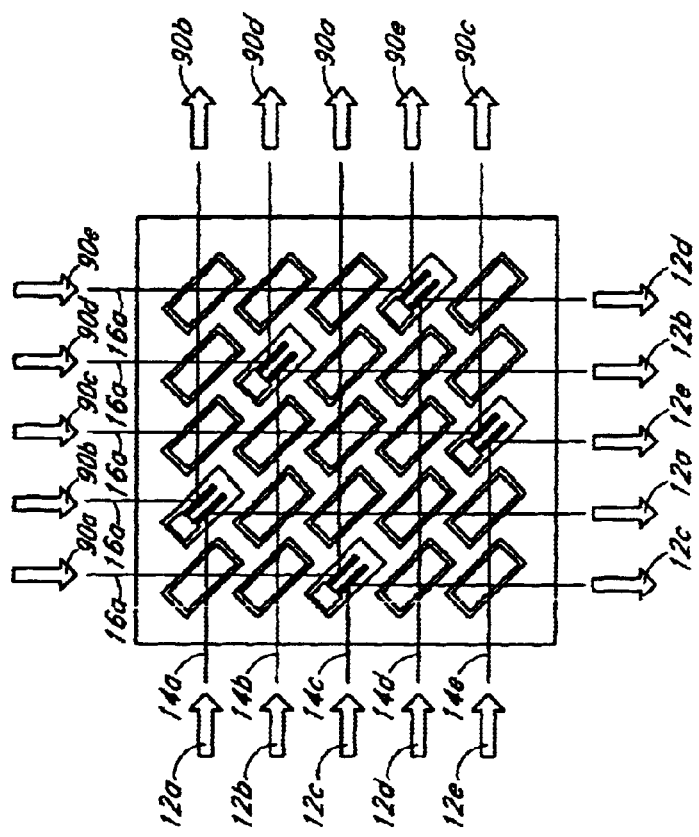
FIG. 16 schematically illustrates an embodiment with modules which each comprise a second reflector surface to be utilized in conjunction with transmit/receive pairs.

The second reflector surface 110 of each module 32 can be utilized in conjunction with transmit/receive pairs, as schematically illustrated in FIG. 16. In such an embodiment, incoming light beams 12*a*–12*e* are initially propagating along beam paths 14*a*–14*e*, and incoming second light beams 90*a*–90*e* are initially propagating along second beam paths 16*a*–16*e*. When the module 32 corresponding to beam path 14*a* and second beam path 16*b* is activated, light beam 12*a* is reflected by the reflector surface 42 from beam path 12*a* to second beam path 16*b*. At the same time, second light beam 90*b* is reflected by the second reflector surface 110 from the second beam path 16*b* into the beam path 12*a*. Thus, the light beam 12*a* and second light beam 90*b* have been exchanged with each other. Similarly, other pairs of light beams 12 and second light beams 90 can be exchanged with one another. Using the embodiment schematically illustrated in FIG. 16, up to five pairs of light beams 12 and second light beams 90 can be exchanged with one another.

In other embodiments, the apparatus 10 can be used as an optical attenuator to reduce the amount of optical power propagating along one or more of the beam paths 14. In one embodiment as schematically illustrated in FIG. 5, five light beams 12*a*–12*e* propagate into the apparatus 10 along their respective beam paths 14*a*–14*e*, and each light beam 12 has a corresponding module 32 and reflector 40. Each of the reflectors 40*a*–40*e* of the array 30 is individually addressable, so the five light beams 12*a*–12*e* can be individually attenuated. A reflector 40 in the first position 62 intercepts at least a portion of the respective beam path 14, and a reflector 40 in the second position 64 does not intercept the portion of the respective beam path 14.

Figure 17:
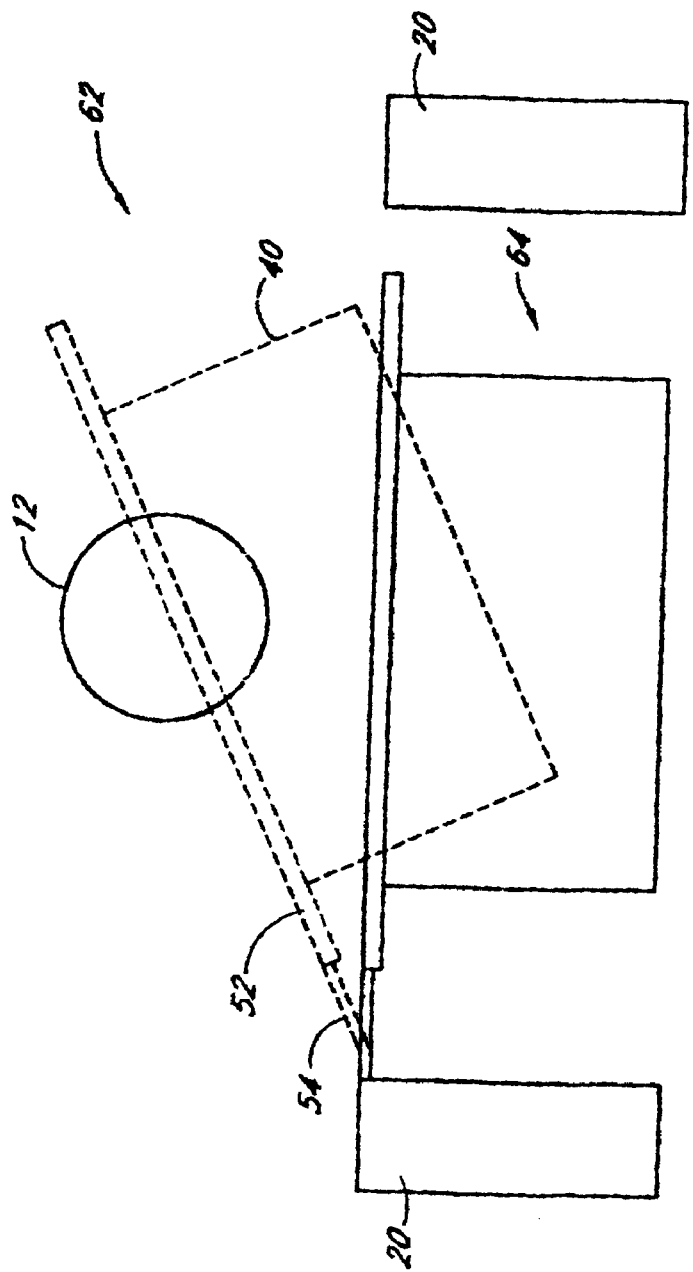
FIG. 17 schematically illustrates an embodiment in which the light beam can be attenuated by applying a selected amount of electrical current to the reflector driver to place the reflector in a selected first position.

In certain embodiments, the first position 62 of the reflector 40 is selectable, whereby the reflector 40 in the first position 62 intercepts a selected portion of the respective light beam 12. As described above, the deflection of the reflector 40 is controllable by adjusting the electrical current applied to the reflector driver 60 of the module 32. For example, as schematically illustrated in FIG. 17, the light beam 12 can be attenuated by applying a selected amount of electrical current to the reflector driver 60 to place the reflector 40 in a selected first position 62. In the embodiment schematically illustrated in FIG. 17, the first position 62 is selected such that 50% of the incoming optical power of the light beam 12 continues to propagate along the beam path 14. The remaining 50% of the incoming optical power of the light beam 12 is intercepted partially by the reflector 40 and partially by other components of the module 32, such as the flap 52. In certain other embodiments, the attenuation of light beams 12 can be combined with the switching of light beams. For example, rather than placing the reflector 40 in a first position 62 in which the reflector 40 completely intercepts the light beam 12, the first position 62 can be selected to only intercept a portion of the light beam 12, thereby switching the intercepted portion of the light beam 12 and transmitting the unintercepted portion of the light beam 12.

Figure 18:
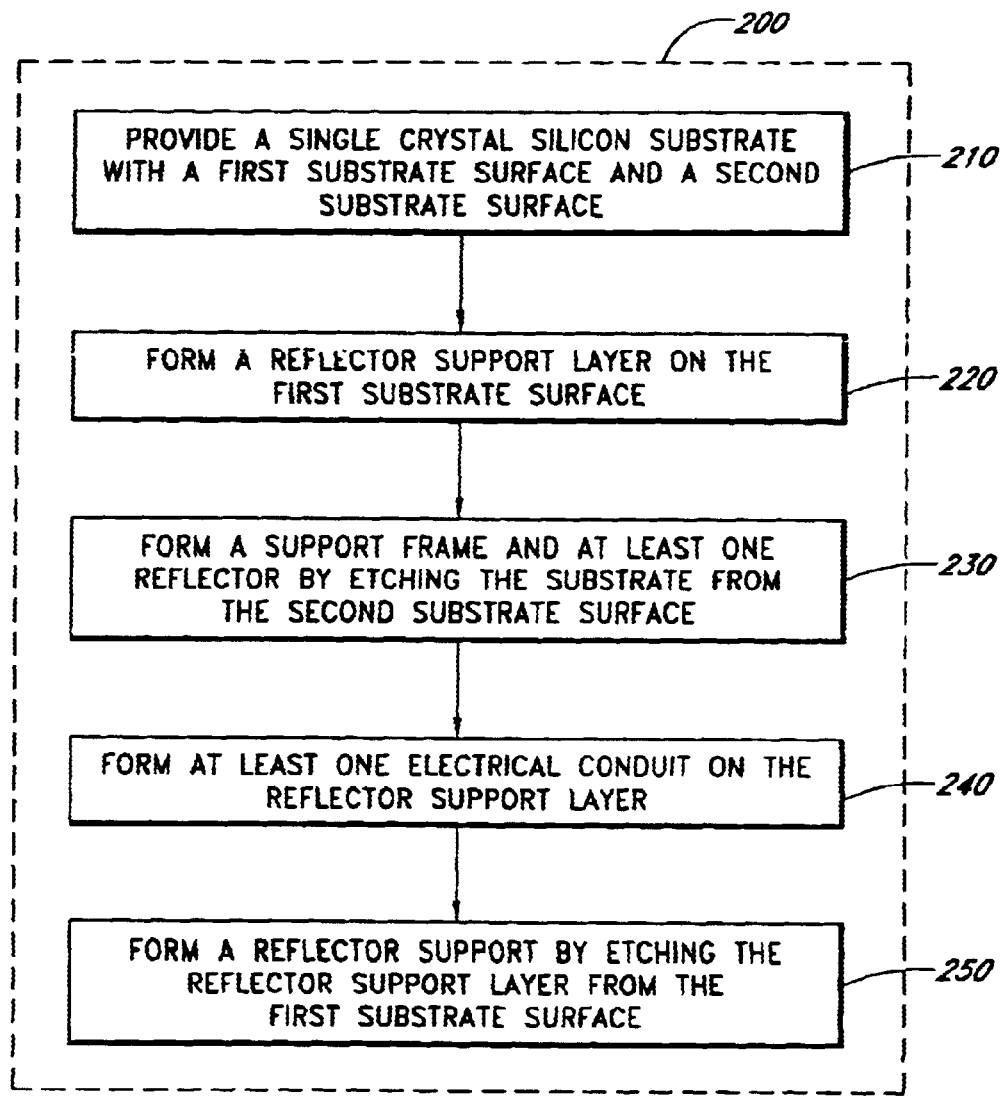
FIG. 18 is a flowchart corresponding to a method of fabricating a module for at least partially intercepting a light beam propagating along a beam path.

FIG. 18 is a flowchart corresponding to a method 200 of fabricating a module 32 for at least partially intercepting a light beam 12 propagating along a beam path 14. The method 200 comprises an operational block 210 for providing a single crystal silicon substrate 300 with a first substrate surface 310 and a second substrate surface 312. The method 200 further comprises an operational block 220 for forming a reflector support layer 320 on the first substrate surface 310. The method 200 further comprises an operational block 230 for forming a support frame 330 and at least one reflector 340 by etching the substrate 300 from the second substrate surface 312. The method 200 further comprises an operational block 240 for forming at least one electrical conduit 350 on the reflector support layer 320. The method 200 further comprises an operational block 250 for forming a reflector support 360 by etching the reflector support layer 320 from the first substrate surface 310. The reflector support 360 is mechanically coupled to the support frame 330 and the reflector 340. The reflector support 360 is movable such that the reflector 340 is movable substantially perpendicularly to the first substrate surface 310. FIGS. 19A–19K schematically illustrate the formation of the module 32 using one embodiment of the method 200.

A single crystal silicon substrate 300 with a first substrate surface 310 and a second substrate surface 312 is provided in the operational block 210. In the embodiment schematically illustrated in FIG. 19A, the single crystal silicon substrate 300 comprises a single crystal silicon substrate wafer with the first substrate surface 310 and second substrate surface 312 each having a {110} crystallographic orientation. Typically, the single crystal silicon substrate wafer is generally circular with a diameter of four inches. In other embodiments, the first substrate surface 310 and second substrate surface 312 each having a {100} crystallographic orientation. More generally, in other embodiments, the first substrate surface 310 and second substrate surface 312 each comprise at least one plateau surface region, with each plateau surface region having a {110} or {100} crystallographic orientation.

Figure 20:
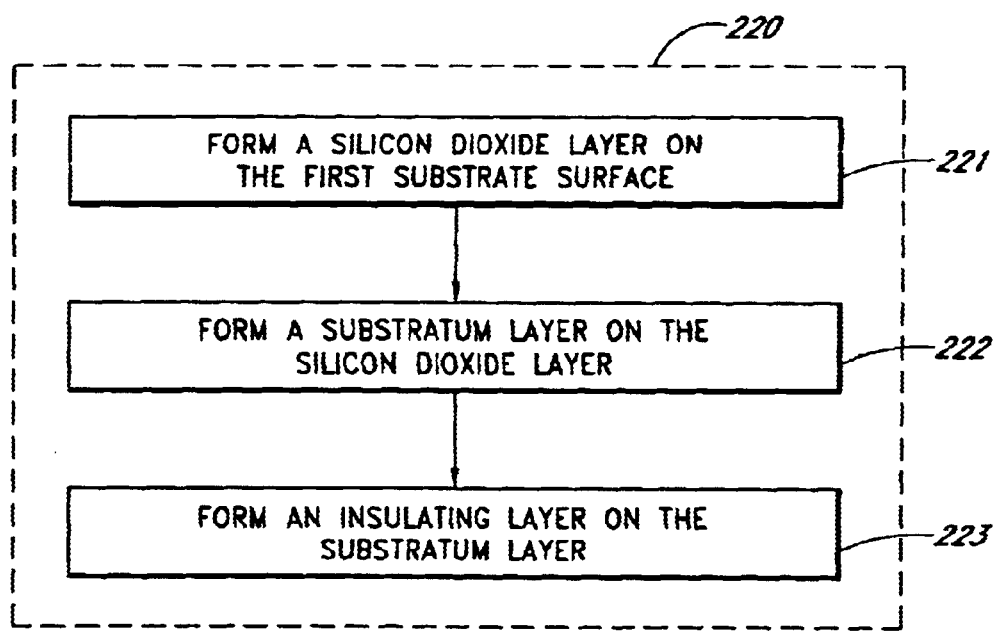
FIG. 20 is a flowchart of one embodiment for the formation of the reflector support layer on the first substrate surface.

A reflector support layer 320 is formed on the first substrate surface 310 in the operational block 220. FIG. 20 is a flowchart of one embodiment of operational block 220 for the formation of the reflector support layer 320 on the first substrate surface 310. In this embodiment, the operational block 220 comprises forming a silicon dioxide layer 321 on the first substrate surface 310 in an operational block 221, and forming a substratum layer 322 on the silicon dioxide layer 321 in an operational block 222. In certain embodiments, such as the embodiment illustrated in FIG. 20, the operational block 220 further comprises forming an insulating layer 323 on the substratum layer 322 in an operational block 223.

In certain embodiments, formation of the silicon dioxide layer 321 is performed by forming low-temperature oxide (LTO) using low-pressure chemical vapor deposition (LPCVD). In such a process, the first substrate surface 310 is exposed to silane and oxygen at pressures of approximately 350 mtorr while being held at temperatures of approximately 450 C. In certain embodiments, the first substrate surface 310 is also exposed to other gases, such as phosphine, to form the silicon dioxide film. The LTO LPCVD process is used to deposit a smooth silicon dioxide layer 321 with a thickness of approximately 2 μm. The deposition rate is a function of temperature, pressure, and gas flows, with higher temperatures favoring higher deposition rates. In the embodiment corresponding to FIG. 19A, the second substrate surface 312 is also exposed to the silane and oxygen and held at approximately 450 C., so a silicon dioxide layer 324 is also formed on the second substrate surface 312. As is described more fully below, this silicon dioxide layer 324 is utilized in later processing steps.

Figure 21:
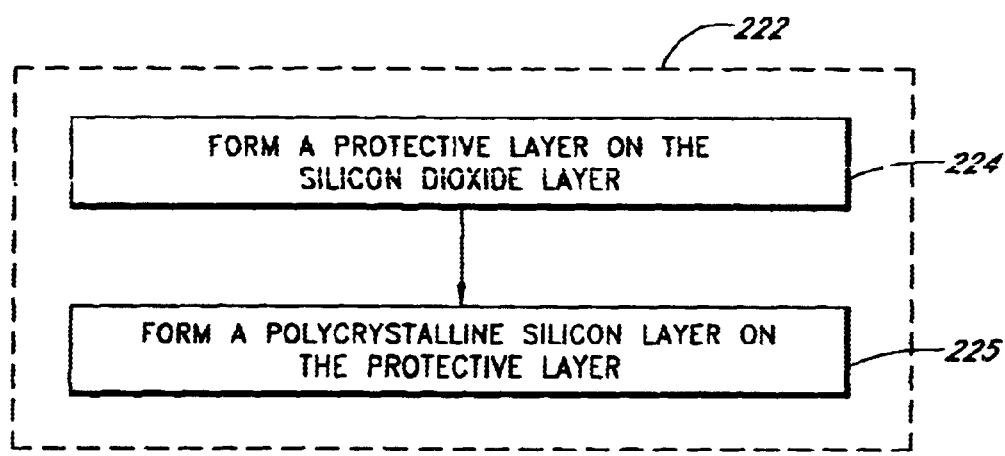
FIG. 21 is a flowchart of one embodiment for forming a substratum layer on the silicon dioxide layer.

A substratum layer 322 is formed on the silicon dioxide layer 321 in the operational block 222, one embodiment of which is shown in FIG. 21. The operational block 222 comprises forming a protective layer 325 on the silicon dioxide layer 321 in an operational block 224, and forming a polycrystalline silicon layer 326 on the protective layer 325 in an operational block 225. In certain embodiments, the protective layer 325 comprises silicon nitride, which is deposited onto the silicon dioxide layer 321 by LPCVD using silicon-containing gases such as silane or dichlorosilane and nitrogen-containing gases such as ammonia. The thickness of the silicon nitride resulting from exposing the silicon dioxide layer 321 at approximately 820 C. for approximately 30 minutes is approximately 0.2 μm. Other embodiments can deposit the silicon nitride using other techniques, or can utilize other materials for the protective layer 325. The polycrystalline silicon layer 326 is formed on the protective layer by LPCVD. Other embodiments can deposit the polycrystalline silicon layer 326 using other techniques.

An insulating layer 323 is formed on the substratum layer 322 in the operational block 223. In certain embodiments, the insulating layer 323 comprises silicon nitride, which is deposited onto the substratum layer 322 using a LPCVD process similar to that used to form the protective layer 325, as described above. The resulting thickness of the insulating layer 323 is approximately 0.2 μm. Other embodiments can deposit the silicon nitride using other techniques.

Figure 19A:
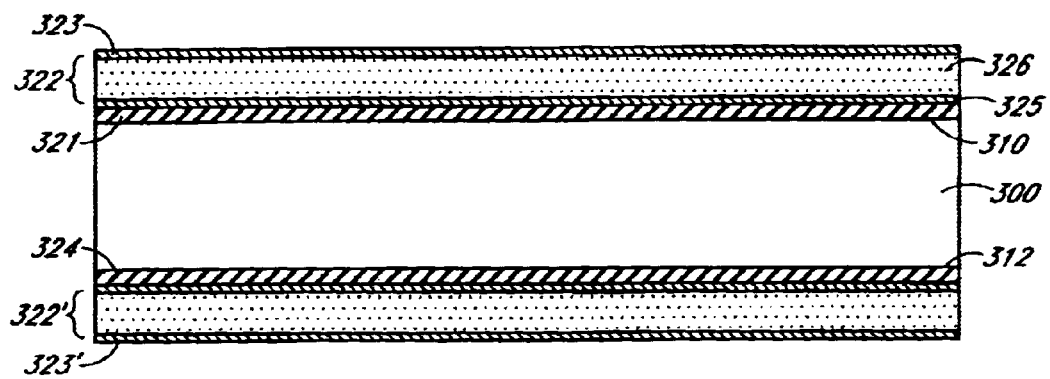
FIGS. 19A–19K schematically illustrate the formation of the module using one embodiment of the method.

The process of forming the substratum layer 322 on the silicon dioxide layer 321 and the insulating layer 323 on the substratum layer 322 can also form similar layers 322', 323' on the second substrate surface 312, as schematically illustrated in FIG. 19A. Using a dry plasma etching process, these layers 322', 323' can be removed while leaving the silicon dioxide layer 324 on the second substrate surface 312, resulting in the structure schematically illustrated in FIG. 19B. Other embodiments can remove the layers 322', 323' using different techniques, or can avoid forming these layers 322', 323' during deposition.

Figure 22:
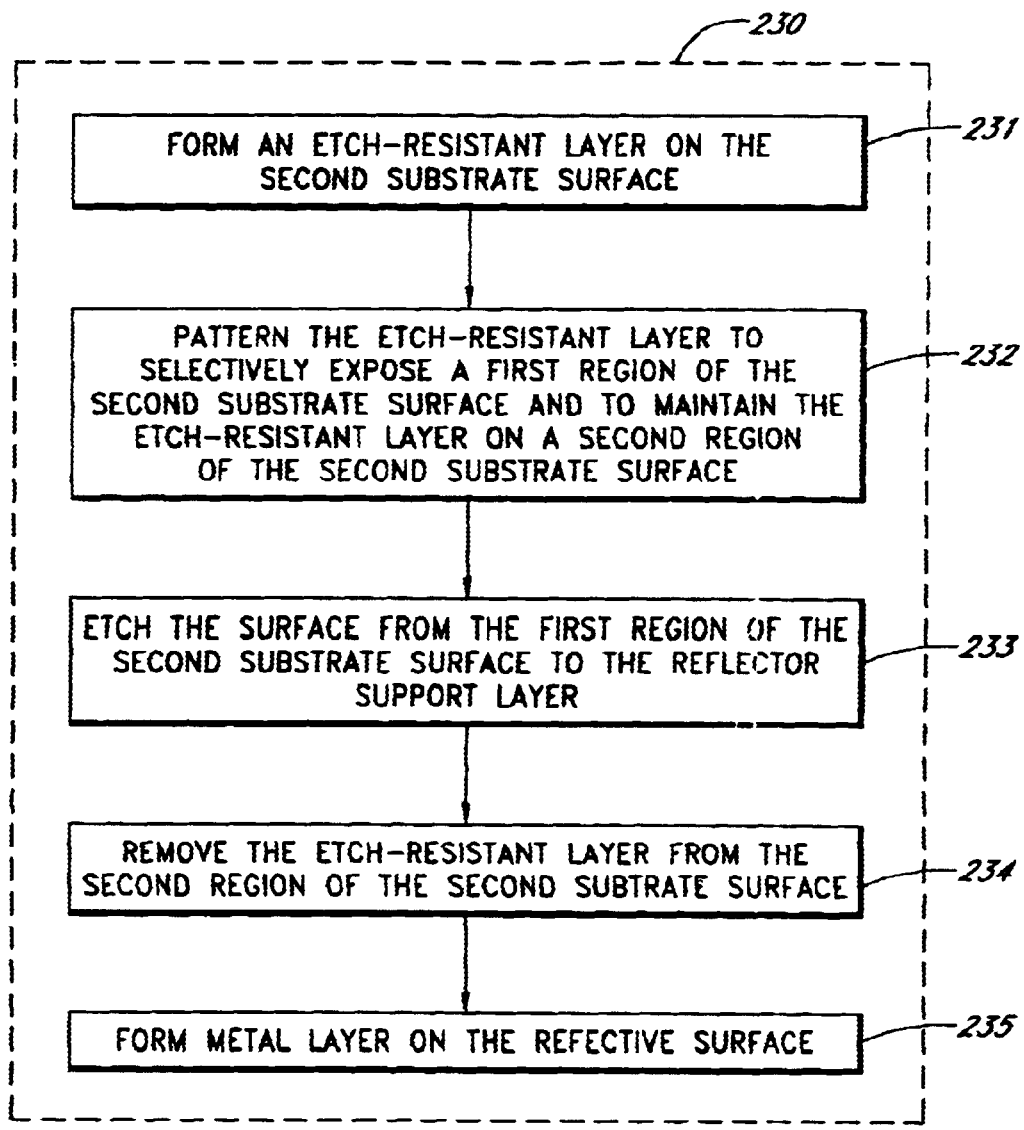
FIG. 22 is a flowchart of one embodiment for forming the support frame and at least one reflector.

A support frame 330 and at least one reflector 340 is formed by etching the substrate 300 from the second substrate surface 312 in the operational block 230, and FIG. 22 is a flowchart of one embodiment of the operational block 230. In this embodiment, the operational block 230 comprises forming an etch-resistant layer 331 on the second substrate surface 312 in an operational block 231. The operational block 230 of this embodiment further comprises patterning the etch-resistant layer 331 on the second substrate surface 312 in an operational block 232 to selectively expose a first region 332 of the second substrate surface 312 and to maintain the etch-resistant layer 331 on a second region 333 of the second substrate surface 312. The operational block 230 of this embodiment further comprises etching the substrate 300 from the first region 332 of the second substrate surface 312 to the reflector support layer 320 in an operational block 233, thereby forming sidewalls 334 of the support frame 330 and at least one reflective surface 335 of the reflector 340. The operational block 230 of this embodiment further comprises removing the etch-resistant layer 331 from the second region 333 of the second substrate surface 312 in an operational block 234.

Figure 19B:
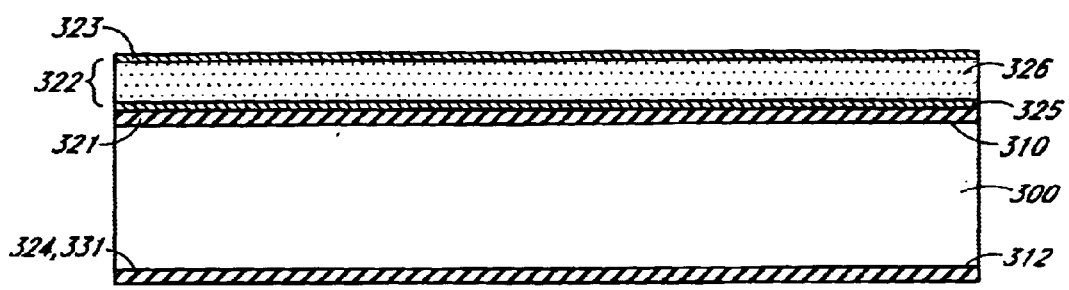

In certain embodiments, the etch-resistant layer 331 comprises silicon dioxide, and the etch-resistant layer 331 can be formed on the second substrate surface 312 while the silicon dioxide layer 321 is formed on the first substrate surface 310, as described above. In such an embodiment, the etch-resistant layer 331 comprises the silicon dioxide layer 324 on the second substrate layer 312, as schematically illustrated in FIG. 19B. Alternatively, other embodiments can utilize different materials for the etch-resistant layer 331, or can form the etch-resistant layer 331 in a separate step from the formation of the silicon dioxide layer 321 on the first substrate surface 310.

Figure 19C:
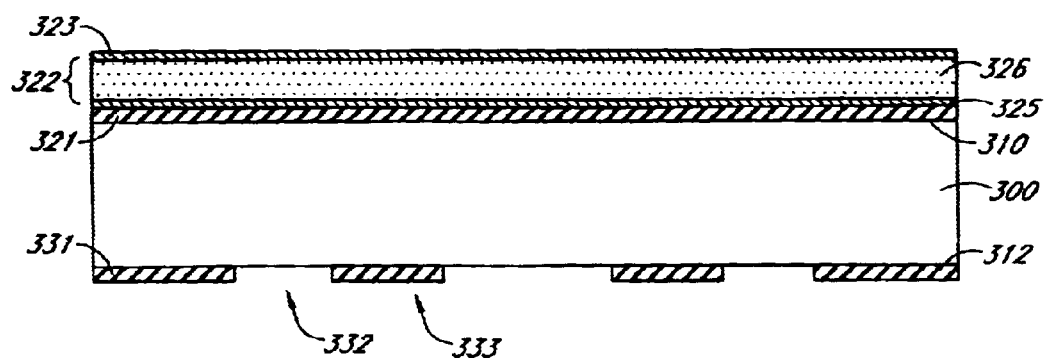

In certain embodiments, the patterning of the etch-resistant layer 331 can be performed using photolithography. In such an embodiment, a photoresist layer of approximately 10 μm thickness is spin-coated onto the etch-resistant layer 331, exposed to a pattern of light, and developed, thereby leaving a patterned photoresist layer on the etch-resistant layer 331. Using a standard wet etching technique, portions of the etch-resistant layer 331 can be removed, thereby selectively exposing the first region 332 of the second substrate surface 312 while maintaining the etch-resistant layer 331 on the second region 333 of the second substrate surface 312. FIG. 19C schematically illustrates a resulting structure corresponding to this embodiment. Persons skilled in the art can select appropriate photoresist layers and techniques in accordance with embodiments of the present invention.

Figure 19D:
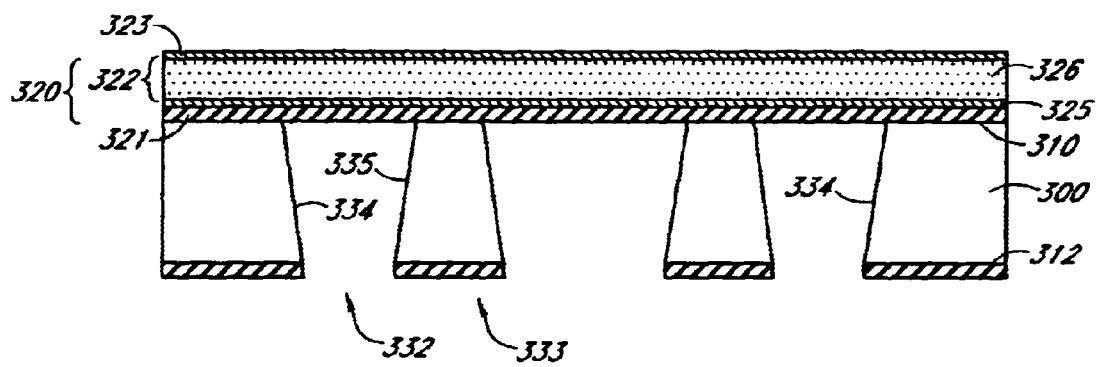

In certain embodiments, the etching of the substrate 300 from first region 332 of the second substrate surface 312 is performed using a deep-reactive ion etching (DRIE) process. One example of an etching process compatible with embodiments of the present invention is the "Bosch" process for anisotropically plasma etching silicon to provide laterally defined recess structures. This process is described in U.S. Pat. No. 5,501,893, entitled "Method of Anisotropically Etching Silicon," which issued to Laermer, et al., and which is incorporated in its entirety by reference herein. The Bosch process yields etched regions with long sidewalls. The etching of the substrate 300 continues until the reflector support layer 320 is reached, thereby forming the sidewalls 334 and the reflective surface 335. FIG. 19D schematically illustrates a resulting structure corresponding to this embodiment.

Figure 19E:
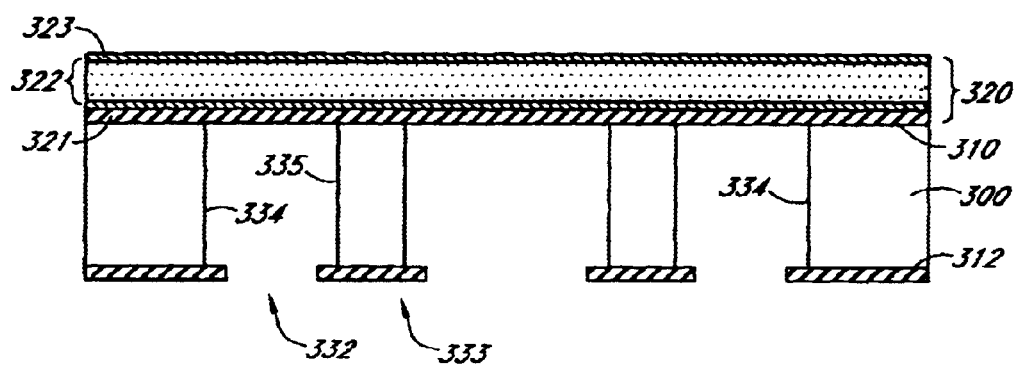

As schematically illustrated in FIG. 19D, the sidewalls 334 and reflective surface 335 resulting from the DRIE process in certain embodiments do not have the desired crystallographic orientation, so the etching of the substrate 300 can also include an anisotropic wet etch process subsequent to the DRIE process. An example of an anisotropic wet etch process compatible with embodiments of the present invention includes exposing the substrate 300 to an aqueous solution of tetramethylammonia hydroxide (TMAH) (e.g., approximately 15% TMAH in $H_2O$) while being held at approximately 90 C. for approximately 3–3.5 hours. In alternative embodiments, a KOH solution or an ethylene diamine/pyrocatecol (EDP) solution can be used in the wet etch process. Persons skilled in the art can select other etching processes to form the sidewalls 334 and reflective surface 335 in accordance with embodiments of the present invention. As schematically illustrated in FIG. 19E, the anisotropic wet etch process yields generally straight sidewalls 334 and reflective surface 335 which are generally perpendicular to the reflector support layer 320.

Figure 19F:
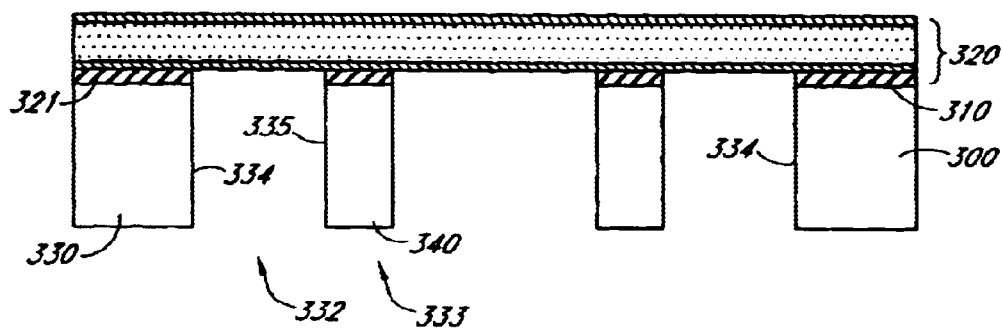

The formation of the support frame 330 and the reflector 340 includes removing the etch-resistant layer 331 from the second region 333 of the second substrate surface 312. In one embodiment, the removal of the etch-resistant layer 331 is performed by a wet etching process using a 5% HF aqueous solution. The wet etching process terminates at the protective layer 325 of the reflector support layer 320. In this way, the protective layer 325 protects the other layers of the reflector support layer 320. Besides removing the etch-resistant layer 331, in embodiments in which the reflector support layer 320 comprises a silicon dioxide layer 321, the silicon dioxide layer 321 of the reflector support layer 320 is also removed from a portion of the reflector support layer 320 corresponding to the first region 332 of the substrate 300. In alternative embodiments, the silicon dioxide layer 321 is removed during a separate process from the removal of the etch-resistant layer 331. The resulting structure is schematically illustrated in FIG. 19F.

Figure 19G:
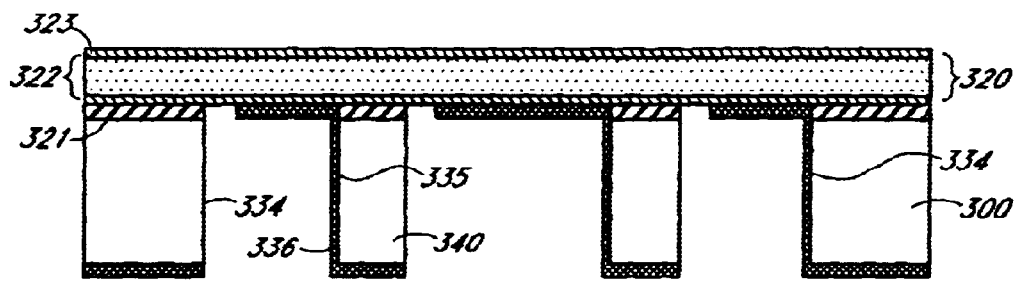

In certain embodiments, the formation of the support frame 330 and the reflector 340 further comprises forming a metal layer 336 on the reflective surface 335 of the reflector 340 in an operational block 235, as illustrated in the flowchart of FIG. 22. One example of such an embodiment includes deposition of aluminum onto the reflective surface 335. Another example of such an embodiment includes thermal evaporation of an adhesion layer onto the reflective surface 335 from the second substrate surface 312, followed by thermal evaporation of a gold layer onto the adhesion layer from the second substrate surface 312. The adhesion layer can comprise various materials, examples of which include, but are not limited to, chromium and titanium. In order to deposit the metal layer 336, the substrate 300 is typically tilted with respect to the thermal evaporation direction by approximately 10°. These thermal evaporation processes are typically performed in a vacuum chamber with a vacuum pressure of approximately $10^{-7}$ torr. As described above, the reflectivity and transmittance of the metal layer is a function of its thickness. In certain embodiments, the thickness of the chromium layer is approximately 150 Å and the thickness of the gold layer is approximately 0.2–0.5 µm. Examples of other materials for the metal layer 336 which are compatible with embodiments of the present invention include, but are not limited to, copper and aluminum. The resulting structure is schematically illustrated in FIG. 19G.

Figure 23:
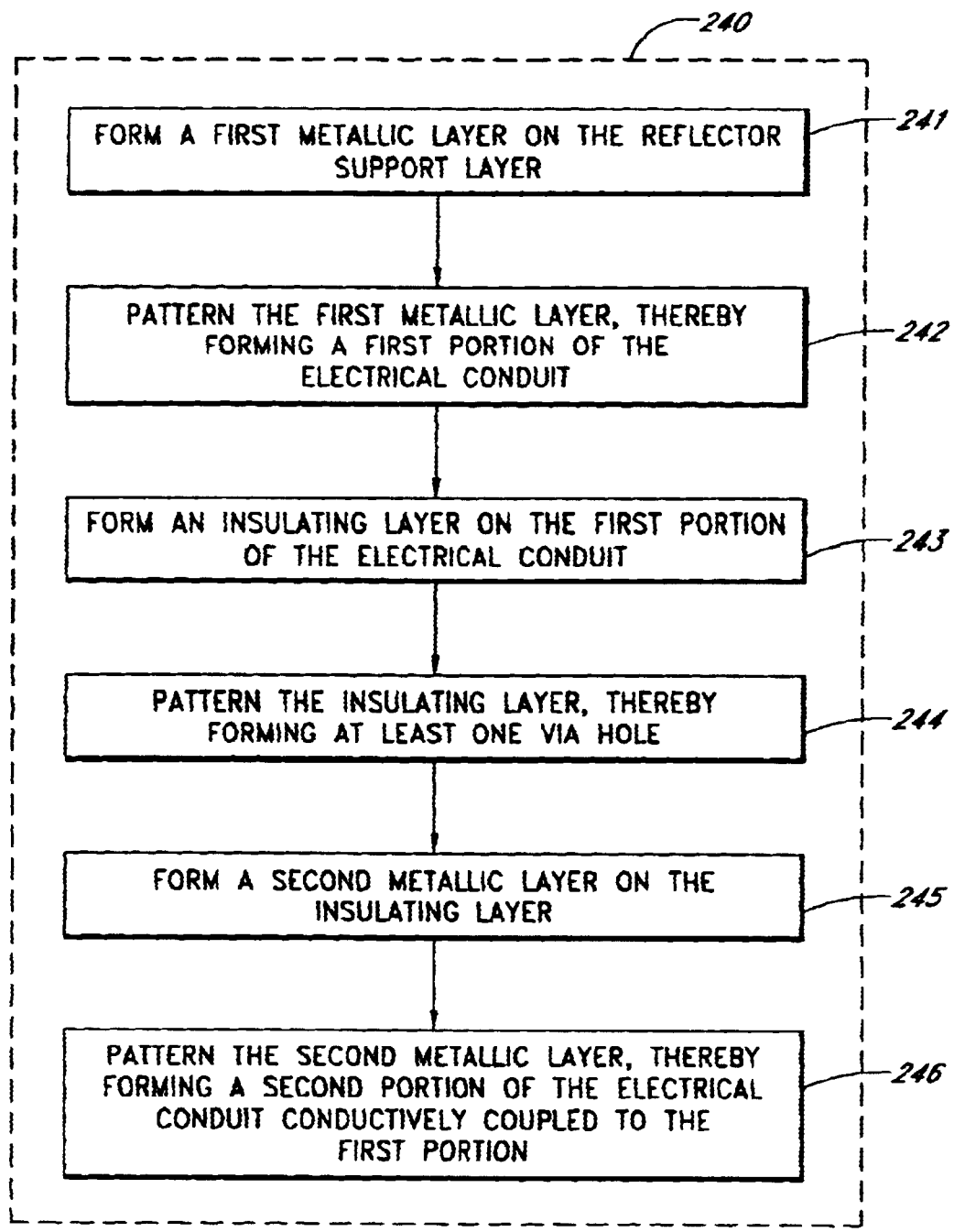
FIG. 23 is a flowchart of one embodiment for the formation of the electrical conduit on the reflector support layer.

One embodiment of the formation of the electrical conduit 350 on the reflector support layer 320 of the operational block 240 is illustrated in the flowchart of FIG. 23. This embodiment comprises forming a first metallic layer 341 on the reflector support layer 320 in an operational block 241. This embodiment further comprises patterning the first metallic layer 341, thereby forming a first portion 342 of the electrical conduit 350, in an operational block 242. This embodiment further comprises forming an insulating layer 343 on the first portion 342 of the electrical conduit 350 in an operational block 243, and patterning the insulating layer 343, thereby forming at least one via hole 344 to the first portion 342 of the electrical conduit 350 in an operational block 244. This embodiment further comprises forming a second metallic layer 345 on the insulating layer 343 in an operational block 245, and patterning the second metallic layer 345, thereby forming a second portion 346 of the electrical conduit 350 in an operational block 246. The second portion 346 of the electrical conduit 350 is conductively coupled to the first portion 342 of the electrical conduit 350 through the via hole 344 of the insulating layer 343.

Figure 19H:
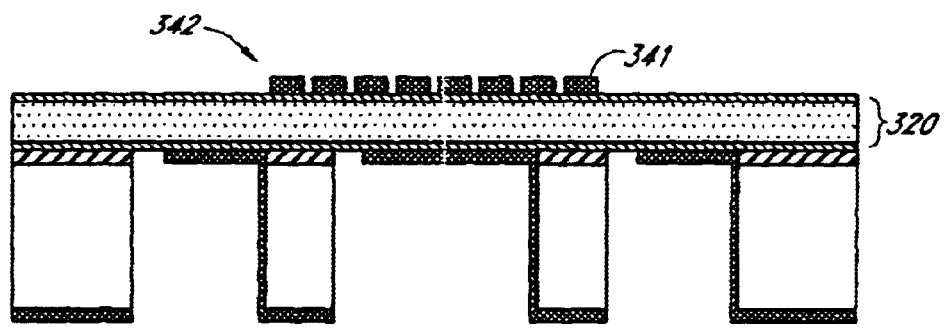

In certain embodiments, the formation of the first metallic layer 341 on the reflector support layer 320 of the operational block 241 includes depositing a chromium layer on the reflector support layer 320 by thermal evaporation and depositing a gold layer on the chromium layer by thermal evaporation. The first metallic layer 341 then comprises a chromium layer and a gold layer. Typically, the thickness of the chromium layer is approximately 100 Å, and the thickness of the gold layer is approximately 1 µm. Using standard photolithographic processes, the first metallic layer 341 can be patterned to form the first portion 342 of the electrical conduit 350 in the operational block 242. In certain embodiments, the patterning of the first metallic layer 341 can be followed by other processes, such as electroplating or electroless deposition, to increase the metal thickness and thereby decrease the resistance. Such processes can require selective masking of other metal portions of the module 32. Persons skilled in the art are able to configure photolithographic or other processes to form the first portion 342 in accordance with embodiments of the present invention. In certain embodiments, the first portion 342 of the electrical conduit 350 has a generally spiral configuration. The resulting structure is schematically illustrated in FIG. 19H.

Figure 19I:
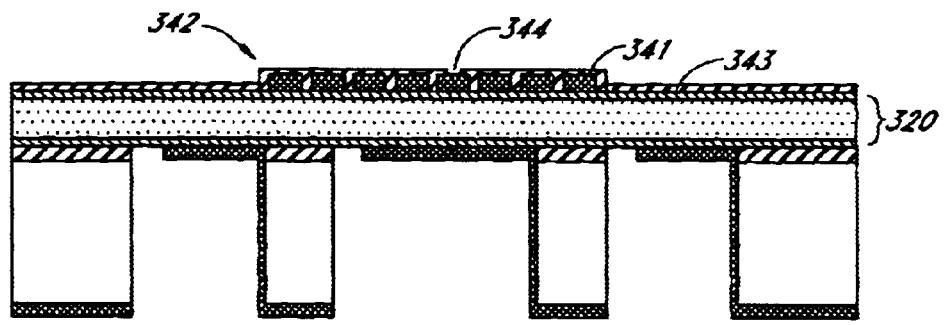

In certain embodiments, the insulating layer 343 comprises silicon dioxide, and the insulating layer 343 is formed in the operational block 243 by a LPCVD process similar to that process which forms the silicon dioxide layer 321 of the reflector support layer 320 in the operational block 221. The thickness of the insulating layer 343 is approximately 1 µm. Using standard photolithographic processes, the insulating layer 343 can be patterned to form the via hole 344 to the first portion 342 of the electrical conduit 350. Persons skilled in the art are able to configure photolithographic processes in accordance with embodiments of the present invention. The resulting structure is schematically illustrated in FIG. 19I.

In certain embodiments, the formation of the second metallic layer 345 on the insulating layer 343 of the operational block 245 includes depositing a chromium layer on the insulating layer 343 and a gold layer on the chromium layer by thermal evaporation as described above in relation to the deposition of the first metallic layer 341. The second metallic layer 345 then comprises a chromium layer and a gold layer. Typically, the thickness of the chromium layer is approximately 100 Å, and the thickness of the gold layer is approximately 1.2 µm. Using standard photolithographic processes, the second metallic layer 345 can be patterned to form the second portion 346 of the electrical conduit 350 in the operational block 246. In certain embodiments, the patterning of the second metallic layer 345 can be followed by other processes, such as electroplating or electroless deposition, to increase the metal thickness and thereby decrease the resistance. Such processes can require selective masking of other metal portions of the module 32. Persons skilled in the art are able to configure photolithographic or other processes to form the second portion 346 in accordance with embodiments of the present invention.

Figure 19J:
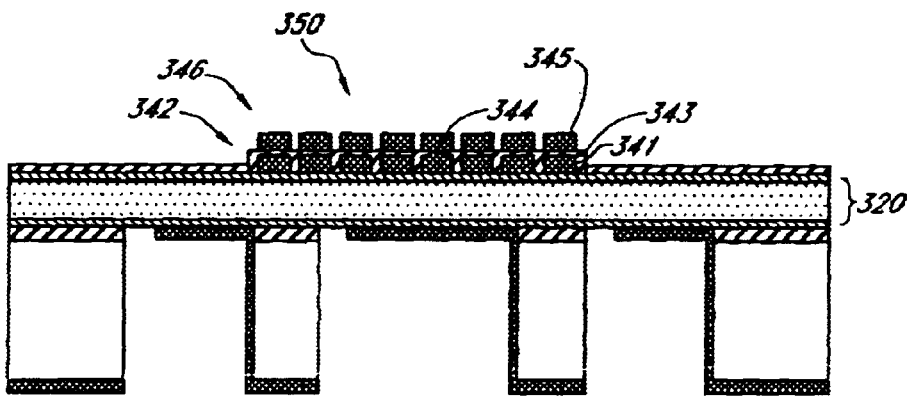

In addition, the via hole 344 is filled with metallic material such that the second portion 346 of the electrical conduit 350 is conductively coupled to the first portion 342 of the electrical conduit 350. In certain embodiments, the second portion 346 of the electrical conduit 350 has a generally spiral configuration. In such an embodiment in which the electrical conduit 350 is part of a magnetic actuator, the direction of current through the spiral of the first portion 342 and the spiral of the second portion 346 is configured so as not to generate forces which effectively cancel each other out. The resulting structure is schematically illustrated in FIG. 19J.

Figure 19K:
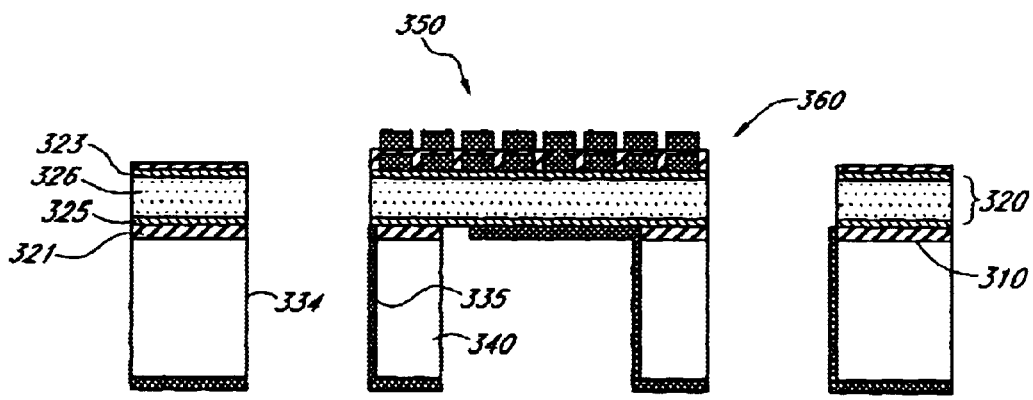

In certain embodiments, the formation of the reflector support 360 of the operational block 250 is performed by etching the reflector support layer 320 from the first substrate surface 310. Using standard photolithographic processes, a patterned photoresist layer can be formed on the reflector support layer 320, the pattern defining the reflector support 360, including any flaps 52 or couplers 54 which comprise the reflector support 360. In embodiments in which the reflector support layer 320 comprises a silicon dioxide layer 321, a protective layer 325 comprising silicon nitride, a polysilicon layer 326, and an insulating layer 323, a plasma etch process can be used. In addition, the portion of the metal layer 336 on the reflector support layer 320 between the sidewalls 334 and the reflective surface 335 can be removed by a wet etch process. Persons skilled in the art are able to configure photolithographic processes in accordance with embodiments of the present invention. The resulting structure is schematically illustrated in FIG. 19K, the structure comprising a reflector support 360 with a reflector 40, a compensation structure 41, and an electrical conduit 350.

Various additional alternative embodiments are compatible with the present invention. For example, certain embodiments of the formation of the substratum layer 322 can omit the protective layer 325, thereby forming the polycrystalline silicon layer 326 on the silicon dioxide layer 321. In certain other embodiments, the reflector support layer 320 on the first substrate surface 310 is protected from being etched during the anisotropic wet etch process during the formation of the support frame 330 and reflector 340 of the operational block 230. In such embodiments, the reflector support layer 320 can be first coated with a protective material, such as Cytop®, an amorphous fluorocarbon polymer which is produced by Asahi Glass Co. of Tokyo, Japan. After the anisotropic wet etch process is completed, the protective material is removed.

During the formation of modules 32 with a second reflector surface 110 in other alternative embodiments, the metal layer can also be formed on the opposite surfaces of the reflector 40 and/or the compensation structure 41 during the operational block 234. Typically, this metal layer is also formed using standard metal evaporation techniques once the substrate 300 and evaporator are re-oriented to deposit metallic material onto the desired surfaces.

In alternative embodiments in which the formation of the insulating layer 343 also forms silicon dioxide residue on the sidewalls 334 or the reflective surfaces 335, a wet etch process can be utilize to remove the silicon dioxide residue from these surfaces. The insulating layer 343 on the first portion 342 of the electrical conduit 350 is typically protected from the wet etch process by a layer of photoresist. Still other alternative embodiments of the method 200 include the formation of the metal layer 336 on the reflective surface 335 of the reflector 340 after the formation of the electrical conduits 350, thereby avoiding the possibility of the silicon dioxide residue being formed on the metal layer 336 of the reflective surface 335.

In still other alternative embodiments, the substrate 300 can be provided with an etch stop layer which comprises a portion of the reflector support layer 320. For example, the substrate 300 can comprise a silicon-on-insulator wafer which comprises a silicon wafer with a subsurface silicon dioxide layer which serves as the etch stop layer. In another example, a boron diffusion layer in the substrate 300 can serve as the etch stop layer. In such embodiments, the reflector support layer 370 can further comprise an epitaxial silicon layer formed on the first substrate surface 310. The support frame 330 and reflector 340 are formed by etching the substrate 300 from the second substrate surface 312 to the etch stop layer. The reflector support layer 320 of such embodiments can also comprise an insulating layer, such as silicon nitride, formed on the first substrate surface 310.

In certain alternative embodiments, the reflector driver 60 receives and is responsive to an electrical signal to selectively move the reflector 40 of a module 32. In such embodiments, the electrical signal can comprise a voltage which charges portions of a reflector driver 60 configured to utilize electrostatic forces to move the reflector 40. In still other embodiments, the reflector 40 can move to the second position 64 when electrical current is applied to the reflector driver 60, and can move to the first position 62 when electrical current is not applied to the reflector driver 60. In such embodiments, the flap 52 can be given an initial displacement by depositing a magnetic material, such as permalloy, on the flap 52.

Typically, multiple MEMS devices, such as the apparatus 10 described herein, are fabricated on the same wafer substrate to take advantage of economies of scale. To separate the MEMS devices from one another, the wafer substrate is diced and separated into chips, each of which comprises at least one of the MEMS devices. However, MEMS devices also typically contain various fragile components, such as the flaps 52, cantilevers 55, and reflectors 40 of the apparatus 10 described herein. These MEMS components are often damaged by the standard processes of dicing and separating the wafer substrate into chips, thereby reducing the yield of MEMS devices obtained from a given wafer substrate.

Previous attempts to improve the yield of MEMS devices from diced and separated wafer substrates have included the addition of a photoresist layer to the wafer substrate, thereby covering the MEMS devices and providing structural support during the dicing and separating processes. However, the application of a photoresist layer includes a spin coating method, which induces forces and stresses which can also damage fragile MEMS devices. Spin coating also is inefficient for large area substrates and the use of photoresist materials leads to environmental, health, and safety issues. In addition, photoresist layers typically are not conformal and have poor step coverage, especially when applied to high aspect ratio structures such as the reflectors 40 of the apparatus 10 described herein.

In certain embodiments of the present invention, the method 200 of fabricating the module 32 further comprises forming a conformal layer 370 by depositing a polymeric material in a vapor phase onto the substrate 300 from the second substrate surface 312 in an operational block 260. One example of a polymeric material compatible with the present invention includes, but is not limited to, parylene. Parylene is the generic name for members of a unique family of thermoplastic polymers that are deposited by using the dimer of para-xylylene (di-para-xylylene, or DPXN). Parylene can be deposited under vacuum conditions from a vapor phase at room temperature. There are three types of commercially available parylene. The basic member of the series is poly-para-xylylene (also referred to as Parylene N), a linear and highly crystalline polymer which exhibits a low dissipation and high dielectric strength. A second type, Parylene C, has para-xylylene monomers which have a chlorine atom replacing one of the aromatic hydrogen atoms in Parylene N. Parylene C also has a low permeability to moisture and other corrosive gases. Parylene D, the third member of the series, also has para-xylylene monomers, but with two chlorine atoms replacing two aromatic hydrogen atoms in the monomer of Parylene N. Parylene D has similar properties to Parylene C, with the ability to withstand higher temperatures. The chemical structure of parylene, its physical properties, and various deposition and patterning techniques are provided in more detail in "Integrated Parylene Micro Electro Mechanical Systems (MEMS)," doctoral thesis of Xuan-Qi Wang from California Institute of Technology, Pasadena, Calif., 2000, which is incorporated in its entirety by reference herein.

Figure 24:
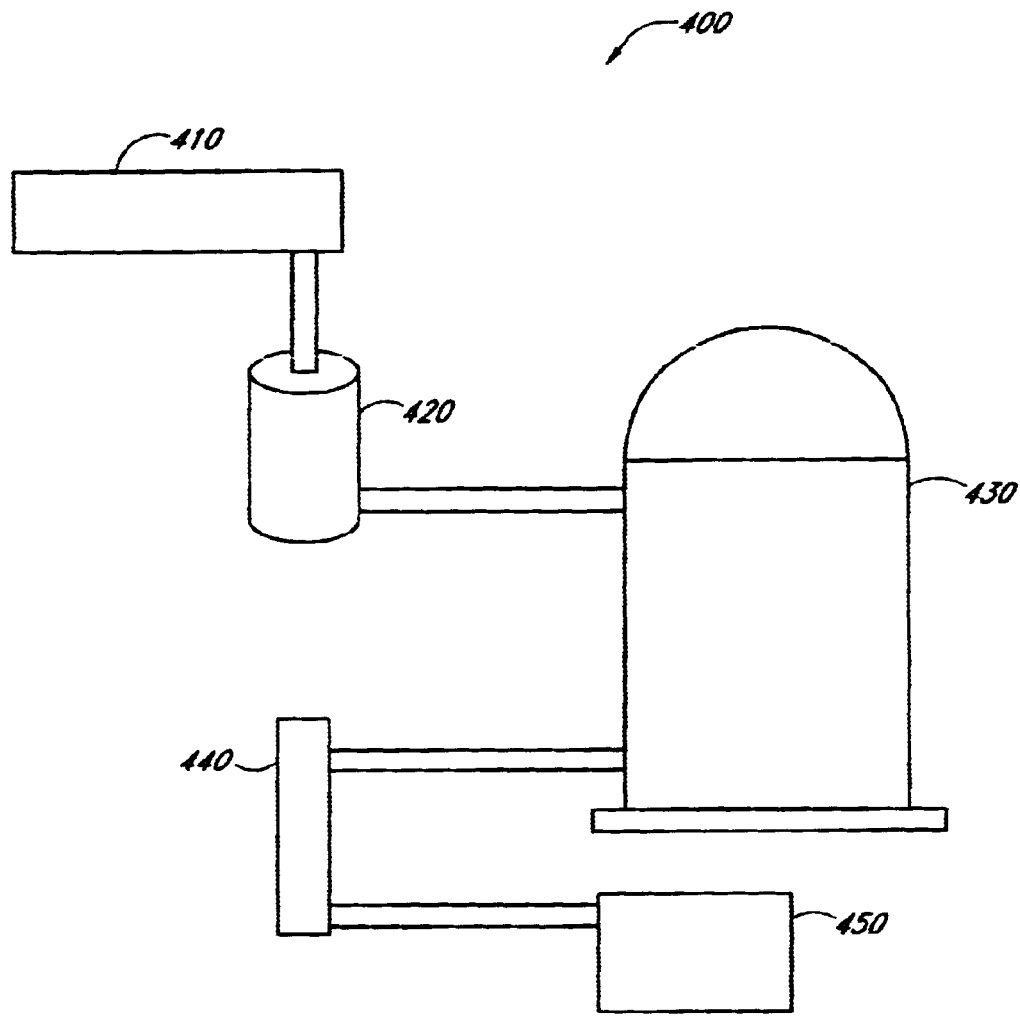
FIG. 24 schematically illustrates an exemplary deposition system for forming a conformal layer in accordance with embodiments of the present invention.
Figure 25:
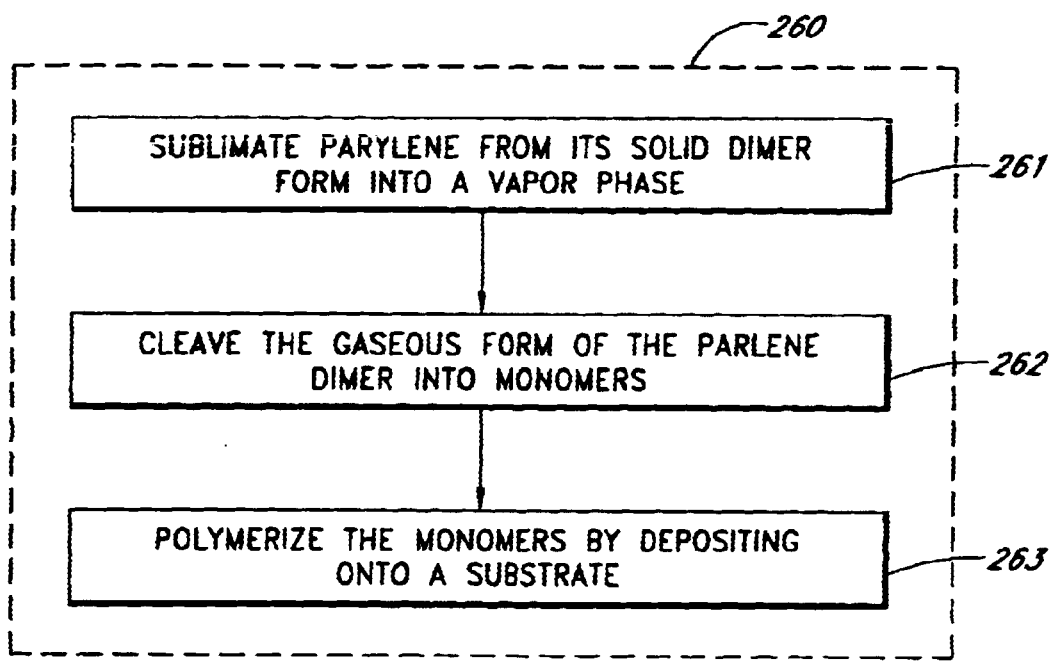
FIG. 25 is a flowchart of one embodiment for the deposition of parylene onto the substrate.

FIG. 24 schematically illustrates an exemplary deposition system 400 for forming a conformal layer 370 by depositing a polymeric material in a vapor phase onto the substrate 300 in accordance with embodiments of the present invention. The deposition system schematically illustrated in FIG. 24 comprises a sublimator 410, a pyrolysis chamber 420, a deposition chamber 430, a cold trap 440, and a vacuum pump 450. In certain embodiments, as illustrated in the flowchart of FIG. 25, the deposition of parylene onto the substrate 300 of the operational block 260 comprises a sublimation process of an operational block 261 in which the parylene sublimates from its solid dimer form into a vapor phase. The sublimation process of the operational block 261 is accomplished in the sublimator 410 by the application of heat to solid parylene while under vacuum conditions. The temperature range for sublimation of parylene is typically between approximately 140 C. and 170 C. The deposition of parylene of the operational block 260 further comprises a pyrolysis process of an operational block 262, in which the gaseous form of the parylene dimer is cleaved into monomers. The pyrolysis process of the operational block 262 is typically performed in a pyrolysis chamber 420 which is heated to above approximately 650 C. The deposition of parylene of the operational block 260 further comprises a polymerization process of an operational block 263 in which the gaseous parylene monomers are deposited onto the substrate and polymerized, which typically occurs at approximately room temperature in the deposition chamber 430. While the sublimation process of operational block 261 and pyrolysis process of operational block 262 are achieved by controlled temperatures, the final deposition rate during the polymerization process of operational block 263 is controlled by the pressure inside the deposition chamber. In certain embodiments, the cold trap 440 and vacuum pump 450 maintain the pressure inside the deposition chamber 430 during the polymerization process of operational block 263 between approximately 20 mtorr and 30 mtorr.

Parylene deposited in this manner yields thin films with a high degree of conformity; i.e., the parylene is deposited on the exposed surfaces at approximately the same rate. For all the types of parylene, the para-xylylene monomers are cross-linked into polymerized long-chain macromolecules to form a thin film which has anisotropic properties and high rigidity. Parylene is also inert, non-toxic, and non-hazardous. It emits no volatile organic compounds during storage, handling, or deposition. Parylene resists room temperature chemical attack and is insoluble in organic solvents up to approximately 150 C. Parylene films are also resistant to permeation by most solvents.

Figure 26A:
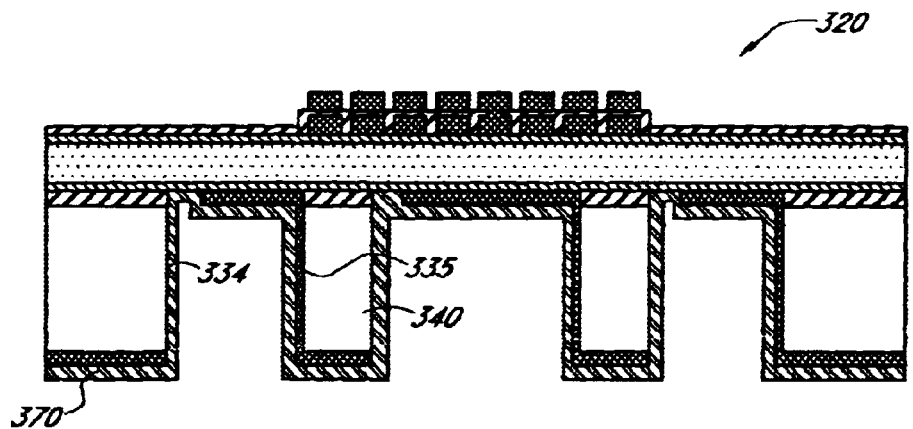
FIG. 26A schematically illustrates one embodiment of the conformal layer formed after the formation of the support frame, reflector, and electrical conduit, but before the formation of the reflector support.
Figure 26B:
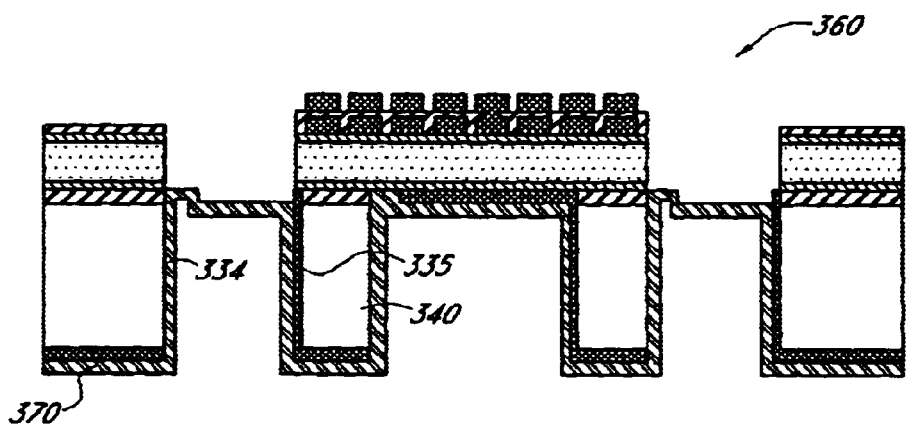
FIG. 26B schematically illustrates one embodiment of the conformal layer after the formation of the reflector support.

As schematically illustrated in FIG. 26A, in certain embodiments, the conformal layer 370 is formed on the substrate 300 after the formation of the support frame 330 and reflector 340 in the operational block 230, after the formation of the electrical conduit 350 in the operational block 240, but before the formation of the reflector support 360 in the operational block 250. The conformal layer 370 deposited from the second substrate surface 312 substantially covers the sidewalls 334, reflective surface 335, metal layers 336, and the reflector support layer 320. FIG. 26B schematically illustrates the conformal layer 370 after the formation of the reflector support 360 in the operational block 250. While the reflector support layer 320 has been etched away from the first substrate surface 310, the conformal layer 370 remains substantially intact. Since the reflector support 360 is formed subsequently to forming the conformal layer 370, the conformal layer 370 provides protection to the reflector 40 from the etching of the reflector support layer 320.

The conformal layer 370 then provides structural support for the reflector support 360 during the dicing and separating of the substrate 300 into individual chips in the operational block 264. The conformal layer 370 is then removed from the modules 32 in an operational block 265, resulting in the structure schematically illustrated in FIG. 19K. In certain embodiments, the conformal layer 370 is removed by a dry plasma etch process which utilizes an oxygen plasma applied to the conformal layer 370 from the second substrate surface 312 for approximately 200 minutes, and from the first substrate surface 310 for approximately 80 minutes.

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. A method of fabricating a module for at least partially intercepting a light beam propagating along, a beam path, the method comprising:

provided a single crystal silicon substrate with a first substrate surface and a second substrate surface, wherein the first substrate surface has a {110} crystallographic orientation;

forming a reflector support layer on the first substrate surface;

forming a support frame and at least one reflector by etching the substrate from the second substrate surface;

forming at least one electrical conduit on the reflector support layer; and forming a reflector support by etching the reflector support layer from the first substrate surface, the reflector support mechanically coupled to the support frame and the reflector, the reflector support movable such that the reflector is movable substantially perpendicularly to the first substrate surface.

2. A method of fabricating a module for at least partially intercepting a light beam propagating along a beam path, the method comprising:

providing a single crystal silicon substrate with a first substrate surface and a second substrate surface;

forming a reflector support layer on the first substrate surface, wherein forming a reflector support layer on the first substrate surface comprises:

forming a silicon dioxide layer on the first substrate surface; and forming a substratum layer on the silicon dioxide layer;

forming a support frame and at least one reflector by etching the substrate from the second substrate surface;

forming at least one electrical conduit on the reflector support layer; and forming a reflector support by etching the reflector support layer from the first substrate surface, the reflector support mechanically coupled to the support frame and the reflector, the reflector support movable such that the reflector is movable substantially perpendicularly to the first substrate surface.

3. The method of claim 2, wherein forming a substratum layer comprises forming a protective layer on the silicon dioxide layer and forming a polycrystalline silicon layer on the protective layer.

4. The method of claim 3, wherein the protective layer comprises silicon nitride.

5. A method of fabricating a module for at least partially intercepting a light beam propagating along a beam path, the method comprising:

providing a single crystal silicon substrate with a first substrate surface and a second substrate surface;

forming a reflector support layer on the first substrate surface;

forming a support frame and at least one reflector by etching the substrate from the second substrate surface, wherein forming a support frame and at least one reflector by etching the substrate from the second substrate surface comprises:

forming an etch-resistant layer on the second substrate surface;

patterning the etch-resistant layer on the second substrate surface to selectively expose a first region of the second substrate surface and to maintain the etch-resistant layer on a second region of the second substrate surface;

etching the substrate from the first region of the second substrate surface to the reflector support layer, thereby forming sidewalls of the support frame and at least one reflective surface of the reflector; and removing the etch-resistant layer from the second region of the second substrate surfaces;

forming at least one electrical conduit on the reflector support layer; and forming a reflector support by etching the reflector support layer from the first substrate surface, the reflector support mechanically coupled to the support frame and the reflector, the reflector support movable such that the reflector is movable substantially perpendicularly to the first substrate surface.

6. The method of claim 5, wherein etching the substrate from the first region of the second substrate surface comprises performing a deep reactive ion etch.

7. The method of claim 6, wherein etching the substrate from the first region of the second substrate surface further comprises performing an anisotropic wet etch subsequently to the deep reactive ion etch.

8. The method of claim 5, wherein the etch-resistant layer comprises silicon dioxide.

9. The method of claim 5, wherein the reflector support layer comprises a silicon dioxide layer on the first substrate surface and a substratum layer on the silicon dioxide layer, and wherein forming a support frame and at least one reflector further comprises removing the silicon dioxide layer from a portion of the reflector support layer corresponding to the first region of the substrate.

10. A method of fabricating a module for at least partially intercepting a light beam propagating along a beam path, the method comprising:

providing a single crystal silicon substrate with a first substrate surface and a second substrate surface;

forming a reflector support layer on the first substrate surface;

forming a support frame and at least one reflector by etching the substrate from the second substrate surface;

forming at least electrical conduit on the reflector support layer 4, wherein forming at least one electrical conduit on the reflector support layer comprises:

forming a first metallic layer on the reflector support layer;

patterning the first metallic layer, thereby forming a first portion of the electrical conduit;

forming an insulating layer on the first metallic layer;

patterning the insulating layer, thereby forming at least one via holes to the first portion of the electrical conduit;

forming a second metallic layer on the insulating layer;

patterning the second metallic layer, thereby forming a second portion of the electrical conduit, the second portion of the electrical conduit being conductively coupled to the first portion of the electrical conduit through the via holes of the insulating layer; and forming a reflector support by etching the reflector support layer from the first substrate surface, the reflector support mechanically coupled to the support frame and the reflector, the reflector support movable such that the reflector is movable substantially perpendicularly to the first substrate surface.

11. The method of claim 10, wherein the first metallic layer and second metallic layer each comprise a chromium layer and a gold layer.

12. The method of claim 10, wherein the insulating layer comprises silicon dioxide.

13. The method of claim 10, wherein the first portion and second portion of the electrical conduit each have a generally spiral configuration.

* * * * *

UNITED STATES PATENT AND TRADEMARK OFFICE
CERTIFICATE OF CORRECTION

PATENT NO.    : 6,709,886 B2
DATED         : March 23, 2004
INVENTOR(S)   : Chen-Wei Chiu et al.

It is certified that error appears in the above-identified patent and that said Letters Patent is hereby corrected as shown below:

<u>Title page,</u>
Item [75], Inventors, please add the following: -- Yu-Chong Tai --

Signed and Sealed this

Twenty-sixth Day of October, 2004

JON W. DUDAS
*Director of the United States Patent and Trademark Office*